United States Patent
Eguchi et al.

(10) Patent No.: US 9,520,318 B2
(45) Date of Patent: Dec. 13, 2016

(54) SEMICONDUCTOR DEVICE

(71) Applicant: Renesas Electronics Corporation, Tokyo (JP)

(72) Inventors: Satoshi Eguchi, Tokyo (JP); Yoshito Nakazawa, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/995,996

(22) Filed: Jan. 14, 2016

(65) Prior Publication Data

US 2016/0133505 A1 May 12, 2016

Related U.S. Application Data

(63) Continuation of application No. 14/590,937, filed on Jan. 6, 2015, now Pat. No. 9,252,262.

(30) Foreign Application Priority Data

Jan. 10, 2014 (JP) .................................. 2014-003504

(51) Int. Cl.
  *H01L 21/761* (2006.01)
  *H01L 21/265* (2006.01)
  (Continued)

(52) U.S. Cl.
  CPC ......... *H01L 21/761* (2013.01); *H01L 21/0415* (2013.01); *H01L 21/26506* (2013.01);
  (Continued)

(58) Field of Classification Search
  None
  See application file for complete search history.

(56) References Cited

U.S. PATENT DOCUMENTS 5,441,901 A   8/1995  Candelaria
5,877,515 A   3/1999  Ajit
(Continued)

FOREIGN PATENT DOCUMENTS

GB   2 306 250 A    4/1997
JP   H 7-58328 A    3/1995
JP   2001-94098 A   4/2001

OTHER PUBLICATIONS

Notice of Allowance in U.S. Appl. No. 14/590,937 dated Sep. 30, 2015.
(Continued)

*Primary Examiner* — Joseph Schoenholtz
(74) *Attorney, Agent, or Firm* — McGinn IP Law Group, PLLC

(57) ABSTRACT

A method for manufacturing a semiconductor device including a cell region and a peripheral region formed outside the cell region, comprising the steps of (a) providing a semiconductor substrate including a first epitaxial layer of a first conductivity type formed over a main surface thereof, (b) doping a lower band gap impurity for making the band gap smaller than the band gap of the first epitaxial layer before doping into the first epitaxial layer in the cell region, and thereby forming a lower band gap region, (c) after the step (b), forming a plurality of first column regions of a second conductivity type which is the opposite conductivity type to the first conductivity type in such a manner as to be separated from one another in the first epitaxial layer extending from the cell region to the peripheral region, and (d) after the step (c), forming a second epitaxial layer.

11 Claims, 24 Drawing Sheets

(51) Int. Cl.
  *H01L 29/66* (2006.01)
  *H01L 21/04* (2006.01)
  *H01L 29/16* (2006.01)
  *H01L 29/861* (2006.01)
  *H01L 29/78* (2006.01)
  *H01L 29/165* (2006.01)
  *H01L 29/06* (2006.01)
  *H01L 29/739* (2006.01)
  *H01L 29/10* (2006.01)
  *H01L 29/08* (2006.01)

(52) U.S. Cl.
  CPC .... *H01L 21/26513* (2013.01); *H01L 29/0634* (2013.01); *H01L 29/16* (2013.01); *H01L 29/165* (2013.01); *H01L 29/1608* (2013.01); *H01L 29/66068* (2013.01); *H01L 29/7395* (2013.01); *H01L 29/7811* (2013.01); *H01L 29/861* (2013.01); *H01L 29/0878* (2013.01); *H01L 29/1095* (2013.01); *H01L 29/66712* (2013.01)

(56) References Cited

U.S. PATENT DOCUMENTS

| | | | | |
|---|---|---|---|---|
| 2008/0185593 A1* | 8/2008 | Saggio | ............... | H01L 29/0634 257/77 |
| 2010/0059818 A1* | 3/2010 | Sasaki | ............... | H01L 29/0634 257/339 |
| 2012/0326207 A1* | 12/2012 | Yoshimochi | ......... | H01L 29/866 257/139 |
| 2013/0221427 A1* | 8/2013 | Siemieniec | .......... | H01L 29/407 257/330 |
| 2014/0001552 A1* | 1/2014 | Hirler | .................. | H01L 29/408 257/339 |

OTHER PUBLICATIONS

S. M. Sze and G. Gibbons, "Avalanche Breakdown voltage of abrupt and linearly graded p—n junctions in Ge, Si, GaAs, and Gap", Applied Physics Letters vol. 8, No. 5, pp. 111-113, Mar. 1, 1966.
Extended European Search Report dated May 20, 2015.

* cited by examiner

SEMICONDUCTOR DEVICE

CROSS-REFERENCE TO RELATED APPLICATIONS

The present application is a Continuation Application of U.S. patent application Ser. No. 14/590,937, filed on Jan. 6, 2015, which is based on Japanese Patent Application No. 2014-003504 filed on Jan. 10, 2014, the contents of which is incorporated herein by reference in its entirety.

BACKGROUND

The present invention relates to a semiconductor device. It relates to a technology effectively applicable to a semiconductor device including a power semiconductor element represented by, for example, a MOSFET (Metal Oxide Semiconductor Field Effect Transistor).

In Japanese Unexamined Patent Publication No. 2001-94098 (Patent Document 1), there is described a technology of controlling the position for causing avalanche breakdown in a MOSFET using silicon carbide (SiC) as a constituent material. Specifically, in Patent Document 1, the surface layer part of the epitaxial layer is doped with carbon (C) as inactive ion species, and is doped with boron (B) as a conductive impurity, thereby to form a high concentration deep base layer; thus, avalanche breakdown is caused at the high concentration deep base layer.

Japanese Unexamined Patent Publication No. 7-58328 (Patent Document 2) describes the following technology: a p type SiC layer having a wide band gap is formed in the inside of an element region in which an IGBT used as a silicon constituent material is formed.

In Non-Patent Document 1, there is introduced an approximate expression giving the breakdown voltage of the pn junction for use in devices represented by MOSFET, IGBT (Insulated Gate Bipolar Transistor), and diode.

U.S. Pat. No. 5,441,901 (Patent Document 3) describes the following: the band gap may be set lower than that of silicon, or the band gap may be set higher than that of silicon by the concentration of carbon to be doped into silicon.

PATENT DOCUMENTS

[Patent Document 1] Japanese Unexamined Patent Publication No. 2001-94098
[Patent Document 2] Japanese Unexamined Patent Publication No. 7-58328
[Patent Document 3] U.S. Pat. No. 5,441,901

NON-PATENT DOCUMENT

[Non-Patent Document 1] S. a. G. Gibbons, "Avalanche Breakdown voltage of abrupt and linearly graded p-n junctions in Ge, Si, GaAs, and Gap", 1966.

SUMMARY

A power semiconductor element represented by, for example, a power MOSFET or an IGBT is used as a switching element for driving a load. When the load includes an inductance, turning off of a power semiconductor element causes a back electromotive force due to the inductance. The voltage caused by the back electromotive force is applied to the power semiconductor element. In this case, the power semiconductor element is applied with a voltage equal to or larger than the power supply voltage. When the voltage exceeds the avalanche breakdown voltage, an avalanche breakdown phenomenon occurs in the power semiconductor element, so that an avalanche current flows therethrough. When the avalanche current exceeds the avalanche resistance (allowable current amount) of the power semiconductor element, the power semiconductor element is broken. The avalanche resistance denotes the allowable current amount of the avalanche current flowing until breakage is caused by the avalanche breakdown phenomenon. When the local current concentration of the avalanche current occurs in a power semiconductor element, the avalanche resistance is exceeded. As a result, the power semiconductor element becomes more likely to be broken.

From this, in order to improve the reliability of the power semiconductor element, desirably, the device structure of the power semiconductor element is well considered so as to minimize the local current concentration of the avalanche current, and to prevent the avalanche current from exceeding the avalanche resistance.

For example, in a semiconductor chip including a power semiconductor element formed therein, generally, there are a cell region in which a power semiconductor element is formed, and a peripheral region surrounding the outside of the cell region. Herein, attention is paid to the avalanche breakdown voltage. From the viewpoint of preventing the breakage of a power semiconductor element, desirably, the avalanche breakdown voltage of the peripheral region is higher than the avalanche breakdown voltage of the cell region. This is due to the following: when an avalanche breakdown phenomenon occurs in the peripheral region, the avalanche current more concentrates locally than when an avalanche breakdown phenomenon is caused in the cell region; accordingly, the avalanche resistance is exceeded, which makes the power semiconductor element more likely to be broken.

However, with an actual device structure, even at a lower voltage than the avalanche breakdown voltage of the cell region, avalanche breakdown may occur in the peripheral region. Therefore, in order to effectively prevent the breakage of a power semiconductor element due to the avalanche breakdown phenomenon in the power semiconductor element, and to improve the reliability of the semiconductor device including the power semiconductor element, an elaborate configuration is required to prevent the avalanche breakdown phenomenon from occurring in the peripheral region before the avalanche breakdown phenomenon occurs in the cell region. Namely, elaboration is required to set the avalanche breakdown voltage in the peripheral region higher than the avalanche breakdown voltage in the cell region.

Other objects and novel features will be apparent from the description of this specification and the accompanying drawings.

In a semiconductor device in one embodiment, a lower band gap region having a smaller band gap than the band gap of an epitaxial layer is formed in a cell region surrounded by a peripheral region.

Further, in a semiconductor device in another embodiment, a higher band gap region having a larger band gap than the band gap of an epitaxial layer is formed in a shallower region than a prescribed depth in the peripheral region surrounding the cell region.

In accordance with one embodiment, it is possible to improve the reliability of a semiconductor device including a power semiconductor element.

DETAILED DESCRIPTION

Figure 1:
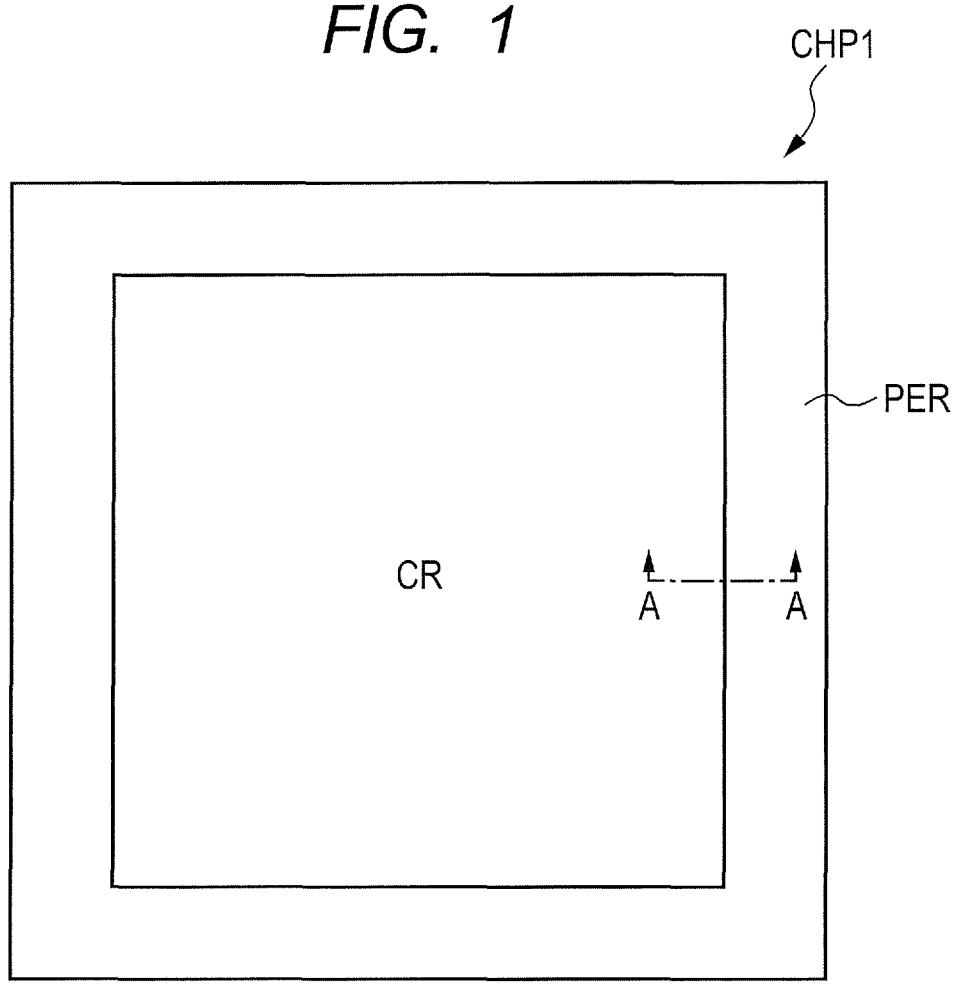
FIG. 1 is a schematic view showing a planar configuration of a semiconductor chip in First Embodiment.

In description of the following embodiment, the embodiment may be described in a plurality of divided sections or embodiments for convenience, if required. However, unless otherwise specified, these are not independent of each other, but are in a relation such that one is a modification example, details, complementary explanation, or the like of a part or the whole of the other.

In the following embodiments, when a reference is made to the number of elements, and the like (including number, numerical value, quantity, range, or the like), the number of elements is not limited to the specific number, but may be greater than or less than the specific number, unless otherwise specified, or except the case where the number is apparently limited to the specific number in principle, or except for other cases.

Further, in the following embodiments, it is naturally understood that the constitutional elements (including element steps, or the like) are not always essential, unless otherwise specified, or except the case where they are apparently considered essential in principle, or except for other cases.

Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Whereas, in all the drawings for describing the following embodiments, the same members are given the same reference signs and numerals in principle, and a repeated description thereon is omitted. Incidentally, for ease of understanding of the drawing, hatching may be provided even in a plan view.

First Embodiment

Basic Idea in First Embodiment

For example, in a pn junction device represented by MOSFET, IGBT, or diode, a pn junction is formed. The breakdown voltage of the pn junction determines the breakdown voltage of the device.

The breakdown voltage (BVdss) of the pn junction herein mentioned means the avalanche breakdown voltage for causing an avalanche breakdown phenomenon. For example, a MOSFET is taken as an example. The breakdown voltage of the pn junction is defined as the voltage at which an avalanche breakdown phenomenon occurs when a voltage is applied to a drain region with a gate electrode and a source region grounded.

Specifically, the avalanche breakdown voltage is the voltage at which an avalanche breakdown phenomenon occurs when the pn junction is applied with a reverse voltage (a voltage to be applied so as to increase the potential barrier formed at the junction). The avalanche breakdown phenomenon is a phenomenon occurring by the following mechanism. Namely, when a reverse voltage is applied to the pn junction, in the depletion layer formed at the pn junction, electrons and holes accelerated under a high electric field collide with the crystal lattice. At this step, the covalent bond establishing a coupling between portions of the crystal lattice is broken, resulting in the formation of another electron and hole pair (impact ionization). Then, the newly generated electron-hole pair also acquires an energy under a high electric field, and collides with the crystal lattice, thereby to generate a still other electron-hole pair. The multiplication phenomenon is grown, so that a large current flows through the depletion layer. This phenomenon is the avalanche breakdown phenomenon.

Such a breakdown voltage of the pn junction is approximated by the following (Expression 1).

$$V_B \approx 60 \times (E_g/1.1)^{3/2} \times (N_B/10^{16})^{-3/4}$$ (Expression 1)

where $V_B$ represents the breakdown voltage of the pn junction, $E_g$ represents the band gap, and $N_B$ represents the impurity concentration. The (Expression 1) indicates that the breakdown voltage of the pn junction is proportional to the 3/2th power of the band gap, and is inversely proportional to the 3/4 th power of the impurity concentration. Thus, the breakdown voltage of the pn junction depends upon the band gap and the impurity concentration. Particularly, from the difference in power of (Expression 1), the change in band gap more largely affects the breakdown voltage than the change in impurity concentration does. For this reason, in the present First Embodiment, attention is paid to the band gap largely affecting the breakdown voltage of the pn junction. Then, as apparent from (Expression 1), the larger the band gap is, the larger the breakdown voltage of the pn junction is. In other words, with a decrease in band gap, the breakdown voltage of the pn junction decreases. This indicates as follows: in order to improve the breakdown voltage of the pn junction, the band gap is desirably increased.

For example, as described in the section of SUMMARY, from the viewpoint of improving the reliability of the power semiconductor element, the avalanche breakdown phenomenon desirably occurs not in the peripheral region but in the cell region. In other words, from the viewpoint of preventing the breakage of the power semiconductor element based on the avalanche breakdown phenomenon, the avalanche breakdown voltage of the peripheral region is desirably set larger than the avalanche breakdown voltage of the cell region.

Thus, in the present First Embodiment, in order to set the avalanche breakdown voltage of the peripheral region larger than the avalanche breakdown voltage of the cell region, attention is paid to the relation between the band gap and the breakdown voltage of the pn junction shown in (Expression 1). Specifically, the basic idea in the present First Embodiment resides in that the band gap of the cell region is set smaller than the band gap of the peripheral region. In other words, the basic idea in the present First Embodiment resides in that the band gap of the peripheral region is set larger than the band gap of the cell region. As a result, the avalanche breakdown voltage of the peripheral region becomes larger than the avalanche breakdown voltage of the cell region. For this reason, before an avalanche breakdown phenomenon occurs in the peripheral region, an avalanche breakdown phenomenon occurs in the cell region. In other words, in accordance with the basic idea in the present First Embodiment, the avalanche breakdown phenomenon can be caused not in the peripheral region in which the avalanche current locally concentrates, but in the cell region in which the avalanche current does not concentrate so much as in the peripheral region. As a result, in accordance with the basic idea in the present First Embodiment, it is possible to effectively prevent breakage of a power semiconductor element due to the avalanche breakdown phenomenon. This can improve the reliability of the semiconductor device including a power semiconductor element.

Then, in the present First Embodiment, elaboration is made to implement the foregoing basic idea. Below, a description will be given to the technical idea in the present First Embodiment subjected to the elaboration.

<Configuration of Semiconductor Device>

In the present First Embodiment, a description will be given by taking a power MOSFET as a power semiconductor element as an example. FIG. 1 is a view schematically showing a planar configuration of a semiconductor chip CHP1 which is a constituent element of a semiconductor device in the present First Embodiment. As shown in FIG. 1, the semiconductor chip CHP1 in the present First Embodiment is formed in, for example, a rectangular shape, and has a cell region CR and a peripheral region PER (termination region). Then, as shown in FIG. 1, the cell region CR is arranged in the inside region of the peripheral region PER. In other words, the peripheral region PER is arranged in the outside region of the cell region CR. In still other words, it can be said that the peripheral region PER is arranged in such a manner as to surround the outside of the cell region CR. Conversely, it can also be said that the cell region CR is arranged in the inside region surrounded by the peripheral region PER.

In the cell region CR, there are formed a plurality of power MOSFETs functioning as, for example, switching elements. On the other hand, in the peripheral region PER, there are formed peripheral structures represented by, for example, a bevel structure obliquely etching the periphery, a Diffused Ring Structure, a field ring structure, and a field plate structure. The peripheral structures are formed based on the design idea that the electric field concentration basically makes it difficult for the avalanche breakdown phenomenon to occur. As described up to this point, in the semiconductor chip CHP1 in the present First Embodiment, a plurality of power MOSFETs are formed in the inside region including the central region, and peripheral structures which are electric field relieving structures are formed in the outside region surrounding the inside region.

Figure 2:
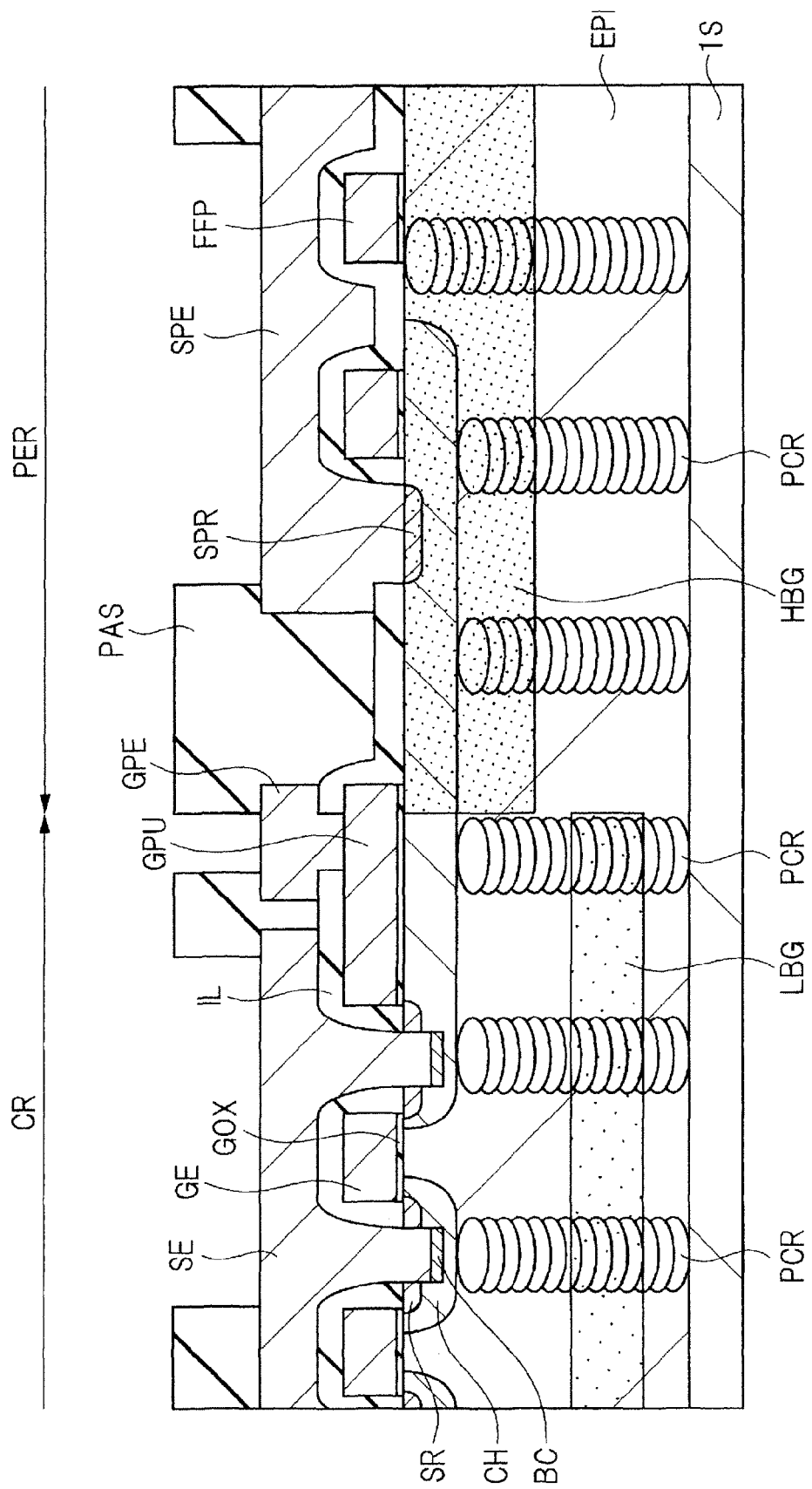
FIG. 2 is a cross sectional view cut along line A-A of FIG. 1.

Then, FIG. 2 is a cross sectional view cut along line A-A of FIG. 1. As shown in FIG. 2, in the semiconductor chip CHP1, there are formed the cell region CR and the peripheral region PER.

First, the device structure of the cell region CR will be described. In FIG. 2, over a semiconductor substrate 1S formed of silicon including an n type impurity such as phosphorus (P) or arsenic (As), there is formed an epitaxial layer EPI. The epitaxial layer EPI is formed of a semiconductor layer including silicon doped with an n type impurity such as phosphorus (P) or arsenic (As) as a main component. The semiconductor substrate 1S and the epitaxial layer EPI form a drain region of the power MOSFET.

Then, a plurality of p column regions PCR are formed in such a manner as to be spaced apart from one another in the epitaxial layer EPI. Each of the p column regions PCR is formed in, for example, a columnar shape, and is formed of a semiconductor region doped with a p type impurity such as boron (B). At this step, the partial region of the epitaxial layer EPI interposed between the mutually adjacent p column regions PCR may be called an n column region. Namely, in the present First Embodiment, in the epitaxial layer EPI over the semiconductor substrate 1S, a plurality of p column regions PCR and a plurality of n column regions are alternately arranged. The structure is called a superjunction structure. Then, at the surface of the epitaxial layer EPI including the superjunction structure formed therein, there is formed an element part.

Specifically, in the element part in the present First Embodiment, a channel region in contact with the p column region PCR is formed at the surface of the epitaxial layer EPI. A source region SR is formed in such a manner as to be internally included in the channel region CH. At this step, the channel region CH is formed of a semiconductor region doped with a p type impurity such as boron (B). The source region SR is formed of a semiconductor region doped with an n type impurity such as phosphorus (P) or arsenic (As).

Then, over a region interposed between the mutually adjacent channel regions CH, there is formed a gate insulation film GOX. Over the gate insulation film GOX, there is formed a gate electrode GE. The gate insulation film GOX is formed of, for example, a silicon oxide film, but is not limited to this, and can also be formed of, for example, a high dielectric constant film higher in dielectric constant than a silicon oxide film. Further, the gate electrode GE is formed of, for example, a polysilicon film. The gate electrode GE is formed in such a manner as to be in alignment with a source region SR. Whereas, an interlayer insulation film IL formed of, for example, a silicon oxide film is formed in such a manner as to cover the top surface and the side surfaces on the opposite sides of the gate electrode GE.

Then, in the surface of the region between the mutually adjacent gate electrodes GE, and exposed from the interlayer insulation film IL, there is formed a trench penetrating through the source region SR, and reaching the channel region CH. At the bottom of the trench, there is formed a body contact region BC. The body contact region BC is formed of a semiconductor region doped with a p type impurity such as boron (B). The impurity concentration of the body contact region BC is higher than the impurity concentration of the channel region CH.

Subsequently, a source electrode SE formed of a barrier conductor film formed of, for example, a titanium tungsten film, and an aluminum film is formed in such a manner as to fill the trench including the body contact region BC formed at the bottom thereof, and to extend over the interlayer insulation film IL covering a plurality of gate electrodes GE. As a result, the source electrode SE is electrically coupled with the source region SR, and is also electrically coupled with the channel region CH via the body contact region BC.

At this step, the body contact region BC has a function of ensuring an ohmic contact with the source electrode SE. The presence of the body contact region BC establishes an electrical coupling between the source region SR and the channel region CH at the same electric potential.

Therefore, it is possible to suppress the ON operation of a parasitic npn bipolar transistor including the source region SR as an emitter region, the channel region CH as a base region, and the epitaxial layer EPI as a collector region. Namely, the source region SR and the channel region CH being electrically coupled at the same electric potential means that a potential difference is not caused between the emitter region and the base region of the parasitic npn bipolar transistor. As a result, it is possible to suppress the ON operation of the parasitic npn bipolar transistor.

Further, in the cell region CR, and in the vicinity of the boundary region with the peripheral region PER, a gate pull-up part GPU formed of a polysilicon film at the same layer as the gate electrode GE is formed over the channel region CH formed in the epitaxial layer EPI via the gate insulation film GOX. Then, the interlayer insulation film IL is formed in such a manner as to cover the top surface and the sidewalls on the opposite sides of the gate pull-up part GPU. In a part of the interlayer insulation film IL, there is formed an opening for exposing a part of the top surface of the gate pull-up part GPU. Then, over the interlayer insulation film IL including the inside of the opening, there is formed a gate pull-up electrode GPE. Herein, the gate pull-up part GPU is electrically coupled with a plurality of gate electrodes GE. Thus, the gate voltage applied to the gate pull-up electrode GPE is applied to each of the plurality of gate electrodes GE via the gate pull-up part GPU.

A surface protective film PAS formed of, for example a silicon oxide film is formed in such a manner as to partially cover the source electrode SE and the gate pull-up electrode GPE. A partial region of the source electrode SE and a partial region of the gate pull-up electrode GPE are exposed from the surface protective film PAS. In the manner described up to this point, a plurality of power MOSFETs are formed in the cell region CR.

Subsequently, a description will be given to the structure of the peripheral region PER formed outside the cell region CR. As shown in FIG. 2, also in the peripheral region PER as in the cell region CR, over the semiconductor substrate 1S, there is formed the epitaxial layer EPI. Then, a plurality of p column regions PCR are formed in such a manner as to be spaced apart from one another in the epitaxial layer EPI. Further, in the surface of the epitaxial layer EPI, there is formed a channel region CH extending from the cell region CR. A source pull-up region SPR is formed in such a manner as to be internally included in the inside of the channel region CH. Further, at the surface of the epitaxial layer EPI, there are formed a plurality of electrodes FFP formed of a polysilicon film at the same layer as the gate electrode GE formed in the cell region CR.

An interlayer insulation film IL is formed over the epitaxial layer EPI in such a manner as to cover the top surfaces and the sidewalls on the opposite sides of the plurality of electrodes FFP. In the interlayer insulation film IL, an opening is formed in such a manner as to expose the source pull-up region SPR. Then, over the interlayer insulation film IL filling the opening, and covering the plurality of electrodes FFP, there is formed a source pull-up electrode SPE formed of a barrier conductor film formed of, for example, a titanium tungsten film, and an aluminum film.

Then, also in the peripheral region PER, a surface protective film PAS formed of, for example, a silicon oxide film is formed in such a manner as to partially cover the source pull-up electrode SPE. A partial region of the source pull-up electrode SPE is exposed from the surface protective film PAS. In the manner described up to this point, a peripheral structure is formed in the peripheral region PER.

<Advantage of Superjunction Structure>

As described above, the power MOSFET in the present First Embodiment is in a superjunction structure. The power MOSFET of such a superjunction structure can provide the following advantages. Namely, with a common power MOSFET, the impurity concentration of the epitaxial layer (drift layer) is reduced, thereby to elongate the depletion layer formed in the epitaxial layer formed at the time of the OFF state of the power MOSFET. As a result, the breakdown voltage is ensured. Therefore, in order to achieve a high breakdown voltage, it is necessary to increase the thickness of the low impurity concentration epitaxial layer. On the other hand, when the drift layer with a low impurity concentration is increased in thickness, the ON resistance of the power MOSFET increases. In other words, in the power MOSFET, the improvement of the breakdown voltage and the reduction of the ON resistance hold the trade off relation.

In this regard, in the power MOSFET in the present First Embodiment, a superjunction structure formed of periodic p column regions and n column regions is formed in the epitaxial layer. In the power MOSFET having the superjunction structure, during the OFF state, a depletion layer extends from the pn junction formed in the boundary region between the p column region and the n column region also in the transverse direction. For this reason, in the power MOSFET having the superjunction structure, even when the impurity concentration of the n column region (epitaxial layer) which is the current path is increased, the depletion layers extending in the inward direction of the n column region interposed between two boundary regions are coupled. This facilitates the depletion of the whole n column regions. As a result, the whole n column regions (the whole epitaxial layer) is depleted in the OFF state. Accordingly, the breakdown voltage can be ensured. In other words, in the power MOSFET having the superjunction structure, while increasing the impurity concentration of the n column region which is the current path, the whole n column regions can be depleted. As a result, the power MOSFET having the superjunction structure can acquire an advantage of being capable of reducing the ON resistance while ensuring a high breakdown voltage.

<Features in First Embodiment>

Then, a description will be given to the features in the present First Embodiment. As shown in FIG. 2, a first feature of the present First Embodiment resides in that, in the cell region CR, in a deeper region than half the depth of the p column region PCR, there is formed a lower band gap region LBG having a smaller band gap than the band gap of the epitaxial layer EPI. Further, considering the fact that the lower band gap region LBG is formed in the epitaxial layer EPI, the lower band gap region LBG is formed at a shallower region than the bottom of the p column region PCR. Then, in the present First Embodiment, the lower band gap region LBG is formed only in the cell region CR, and is not formed in the peripheral region PER. This indicates as follows: considering the (Expression 1) representing the relation between the avalanche breakdown voltage (the breakdown voltage of the pn junction) and the band gap, the avalanche breakdown voltage of the lower band gap region LBG is the lowest in the cell region CR, and is lower than the avalanche breakdown voltage of the peripheral region PER.

Therefore, for example, in the case where a power MOSFET is applied with a voltage equal to or higher than the power supply voltage under the influences of the inductance included in the load, when the voltage exceeds the avalanche breakdown voltage of the lower band gap region LBG, an avalanche breakdown phenomenon is caused in the lower band gap region LBG of the power MOSFET. In other words, in the power MOSFET in the present First Embodiment, the lower band gap region LBG having the lowest avalanche breakdown voltage is formed in the cell region CR. As a result, without causing an avalanche breakdown phenomenon in the peripheral region PER, it is possible to cause an avalanche breakdown phenomenon in the cell region CR. From this, in accordance with the present First Embodiment, it is possible to effectively suppress the occurrence of an avalanche breakdown phenomenon in the peripheral region PER in which the avalanche current locally concentrates. As a result, the power MOSFET can be prevented from being broken due to exceeding of the avalanche resistance of the power MOSFET. Namely, with the power MOSFET in the present First Embodiment, an avalanche breakdown phenomenon can be caused in the cell region CR in which an avalanche current is less likely to locally concentrate than in the peripheral region PER. In other words, in accordance with the present First Embodiment, before an avalanche breakdown phenomenon occurs in the peripheral region PER in which the avalanche resistance of the power MOSFET tends to be exceeded, an avalanche breakdown phenomenon can be caused in the cell region CR in which the avalanche resistance of the power MOSFET is less likely to be exceeded than in the peripheral region PER. As a result, with the power MOSFET in the present First Embodiment, even when the power MOSFET is applied with a voltage exceeding the power supply voltage to cause an avalanche breakdown phenomenon, the situation leading to breakage of the power MOSFET can be avoided.

For this reason, in accordance with the present First Embodiment, it is possible to improve the reliability of the semiconductor device including a power MOSFET.

Thus, in the present First Embodiment, a feature resides in that the lower band gap region LBG is provided in the cell region CR. Below, a description will be given to a specific configuration example of the lower band gap region LBG. First, for example, when the epitaxial layer EPI is formed of silicon (Si), the lower band gap region LBG can be formed of a semiconductor region obtained by doping silicon with at least carbon (C). This is for the following reason: for example, as shown in Patent Document 3, when silicon is doped with low-concentration carbon, the band gap is reduced. Specifically, in the present First Embodiment, for example, the concentration of carbon is set at 0.5 mol % or more and 1.0 mol % or less. As a result, the band gap of the lower band gap region LBG can be made smaller than the band gap of silicon. In this case, for example, the band gap of the lower band gap region LBG is about 0.8 eV which is smaller than the band gap (1.12 eV) of silicon.

Further, for example, when the epitaxial layer EPI is formed of silicon (Si), the lower band gap region LBG can also be formed of a semiconductor region obtained by doping silicon with at least germanium (Ge). This is for the following reason: when silicon is doped with germanium, the band gap is reduced. Specifically, in the present First Embodiment, for example, the concentration of germanium can be set at 10 mol % or more and 30 mol % or less. In this case, for example, the band gap of the lower band gap region LBG is about 0.8 eV which is smaller than the band gap (1.12 eV) of silicon.

Further, for example, when the epitaxial layer EPI is formed of silicon carbide (SiC), the lower band gap region LBG can also be formed of a semiconductor region obtained by doping silicon carbide with at least silicon (Si). This is for the following reason: when silicon carbide is doped with silicon, the band gap is reduced.

Subsequently, a description will be given to the reason why the lower band gap region LBG is desirably formed in a deeper region than half the depth of the p column region PCR. For example, form the viewpoint of setting the avalanche breakdown voltage of the cell region CR lower than the avalanche breakdown voltage of the peripheral region PER, it can be considered as follows: it is essential only that the lower band gap region LBG is provided in the cell region CR, and the formation position of the lower band gap region LBG in the cell region CR does not matter. However, from the viewpoint of suppressing the breakage of the power MOSFET, and improving the reliability of the semiconductor device including the power MOSFET, the lower band gap region LBG is desirably formed in a deeper region than half the depth of the column region PCR. Below, this point will be described.

For example, a consideration will be given to the case where in the cell region CR, the lower band gap region LBG is provided in the vicinity of the surface layer part of the epitaxial layer EPI. In other words, a consideration will be given to the case where the lower band gap region LBG is formed in a shallower region than half the depth of the p column region PCR. Herein, in the vicinity of the surface layer part of the epitaxial layer EPI, there is formed the element part of the power MOSFET. Specifically, in the vicinity of the surface layer part of the epitaxial layer EPI, there is formed a channel region CH. A source region SR is formed in such a manner as to be internally included in the channel region CH. Then, there is formed a trench penetrating through the source region SR, and reaching the channel region CH. A source electrode SE is formed in such a manner as to fill the trench. Further, at the bottom of the trench, there is formed a body contact region BC.

When the lower band gap region LBG is formed in the vicinity of the surface layer part of the epitaxial layer EPI, the lower band gap region LBG and the element part are in proximity to each other. In this case, for example, when an avalanche breakdown phenomenon is caused in the lower band gap region LBG, hole/electron pairs are generated in large amounts based on the avalanche breakdown phenomenon. Then, the electrons generated in a large amount pass through the epitaxial layer EPI (n column region) which is an n type semiconductor region, and flow into a drain electrode formed at the rear side of the semiconductor substrate 1S. On the other hand, the holes generated in a large amount pass through the channel region CH from the p column region PCR, and further flow into the source electrode SE via the body contact region BC. In this manner, an avalanche current flows. In this case, when the lower band gap region LBG and the element part are in proximity to each other, an avalanche current becomes more likely to pass through the body contact region BC from the channel region CH, and to flow in a concentrated manner into the source electrode SE. Namely, when the lower band gap region LBG and the element part are in proximity to each other, the avalanche current flowing from the channel region CH into the source electrode SE tends to increase. This means that the parasitic npn bipolar transistor including the source region SR as the emitter region, the channel region CH as the base region, and the epitaxial layer EPI as the collector region becomes more likely to perform an ON operation. In other words, flowing of a large avalanche current through the channel region CH means flowing of a large avalanche current through the base resistance of the channel region CH. This causes a large voltage drop. This results in an increase in potential difference between the base region formed of the channel region CH and the emitter region formed of the source region SR. In consequence, the parasitic npn bipolar transistor performs an ON operation. Thus, when the parasitic npn bipolar transistor performs an ON operation, a large current uncontrollable with the gate electrode GE of the the power MOSFET flows. This causes the power MOSFET to produce heat more than necessary, leading to breakage. Namely, when the lower band gap region LBG and the element part are set in proximity to each other, the parasitic npn bipolar transistor becomes more likely to perform an ON operation. As a result, the power MOSFET becomes more likely to be broken. This indicates as follows: by providing the lower band gap region LBG in the cell region CR, it is possible to effectively suppress an avalanche breakdown phenomenon from being caused in the peripheral region PER; however, as described above, when the lower band gap region LBG and the element part are also formed in such a manner as to be in proximity to each other in the cell region CR, the breakage of the power MOSFET due to the On operation of the parasitic npn bipolar transistor becomes more likely to occur.

Thus, in the present First Embodiment, the lower band gap region LBG is formed in a deeper region than half the depth of the p column region PCR. In other words, the lower band gap region LBG and the element part are spaced apart from each other. In this case, for example, when an avalanche breakdown phenomenon is caused in the lower band gap region LBG, the holes generated in a large amount flow through the p column region PCR. However, the lower band gap region LBG and the element part are spaced apart from each other. For this reason, the holes generated in a large amount flow in a dispersed manner through the p column regions PCR extending in the direction perpendicular to the paper plane of FIG. 2. In other words, when the lower band gap region LBG and the element part are spaced apart from each other as in the present First Embodiment, an avalanche current becomes less likely to concentrate. Thus, the avalanche current is dispersed. As a result, the concentration of the avalanche current flowing through the channel region CH is suppressed. This can reduce the avalanche current flowing through the channel region CH. This suppresses a voltage drop due to flow of an avalanche current through the base resistance of the channel region CH. Therefore, in accordance with the present First Embodiment, it is possible to reduce the potential difference from the emitter region formed of the source region SR. For this reason, it is possible to suppress the ON operation of the parasitic npn bipolar transistor. Thus, in accordance with the present First Embodiment, it is possible to suppress the breakage of the power MOSFET due to the ON operation of the parasitic npn bipolar transistor.

From the description up to this point, in the present First Embodiment, first, by providing the lower band gap region LBG in the cell region CR, it is possible to suppress an avalanche breakdown phenomenon from being caused in the peripheral region PER. Then, in the present First Embodiment, the lower band gap region LBG formed in the cell region CR is formed in a deeper region than half the depth of the p column region PCR. As a result, even when an avalanche breakdown phenomenon is caused in the lower band gap region LBG, it is possible to effectively suppress the ON operation of the parasitic npn bipolar transistor. In consequence, in accordance with the present First Embodiment, even when a voltage exceeding the power supply voltage is applied to the power MOSFET, thereby to cause an avalanche breakdown phenomenon, the power MOSFET can be prevented from coming to breakage. For this reason, in accordance with the present First Embodiment, it is possible to improve the reliability of the semiconductor device including the power MOSFET.

Then, as shown in FIG. 2, a second feature of the present First Embodiment resides in that, in the peripheral region PER, a higher band gap region HBG having a larger band gap than the band gap of the epitaxial layer EPI is formed in a shallower region than half the depth of the p column region PCR. Further, considering the fact that the higher band gap region HBG is formed in the epitaxial layer EPI, the higher band gap region HBG is formed in a shallower region than the bottom of the p column region PCR. Therefore, in the present First Embodiment, the higher band gap region HBG formed in the peripheral region PER is formed in a shallower region than the lower band gap region LBG formed in the cell region CR.

Herein, a consideration will be given to the (Expression 1) indicating the relation between the avalanche breakdown voltage (the breakdown voltage of the pn junction) and the band gap. This indicates that the avalanche breakdown voltage of the higher band gap region HBG formed in the peripheral region PER is higher than the avalanche breakdown voltage in the cell region CR. Particularly, in the present First Embodiment, the lower band gap region LBG is formed in the cell region CR. As a result, in accordance with the present First Embodiment, by the synergistic effect of the fact that the lower band gap region LBG is formed in the cell region CR, and the fact that the higher band gap region HBG is formed in the peripheral region PER, it is possible to suppress an avalanche breakdown phenomenon from being caused in the peripheral region PER.

Therefore, for example, even when the power MOSFET is applied with a voltage equal to or larger than the power supply voltage under the influence of the inductance included in the load, without causing an avalanche breakdown phenomenon in the peripheral region PER, an avalanche breakdown phenomenon is caused in the lower band gap region LBG of the cell region CR. In other words, with the power MOSFET in the present First Embodiment, the higher band gap region HBG having a high avalanche breakdown voltage is formed in the peripheral region PER. As a result, without causing an avalanche breakdown phenomenon in the peripheral region PER, it is possible to cause an avalanche breakdown phenomenon in the cell region CR. From this, in accordance with the present First Embodiment, it is possible to effectively suppress the occurrence of an avalanche breakdown phenomenon in the peripheral region PER in which the avalanche current locally concentrates. As a result, the power MOSFET can be prevented from being broken due to exceeding of the avalanche resistance of the power MOSFET. Namely, with the power MOSFET in the present First Embodiment, an avalanche breakdown phenomenon can be caused in the cell region CR in which an avalanche current is less likely to locally concentrate than in the peripheral region PER. In other words, in accordance with the present First Embodiment, the higher band gap region HBG is formed in the peripheral region PER. Accordingly, before an avalanche breakdown phenomenon occurs in the peripheral region PER in which the avalanche resistance of the power MOSFET tends to be exceeded, an avalanche breakdown phenomenon can be caused in the cell region CR in which the avalanche resistance of the power MOSFET is less likely to be exceeded than in the peripheral region PER. As a result, with the power MOSFET in the present First Embodiment, even when the power MOSFET is applied with a voltage exceeding the power supply voltage to cause an avalanche breakdown phenomenon, the situation leading to breakage of the power MOSFET can be avoided. For this reason, in accordance with the present First Embodiment, it is possible to improve the reliability of the semiconductor device including a power MOSFET.

Particularly, in the present First Embodiment, in the peripheral region PER, the higher band gap region HBG is formed in a shallower region than half the depth of the p column region PCR. In other words, the higher band gap region HBG is formed in such a manner as to be internally included in the element part (main junction part) formed in the vicinity of the surface layer of the epitaxial layer EPI. The main junction part is assumed to denote, for example, the pn junction formed between the channel region CH and the epitaxial layer EPI. As a result, in accordance with the present First Embodiment, it is possible to effectively suppress the ON operation of the parasitic npn bipolar transistor at the element part (main junction part) formed in the vicinity of the surface layer of the epitaxial layer EPI. In other words, in the present First Embodiment, the higher band gap region HBG is formed in a shallower region than half the depth of the p column region PCR (the region internally including the main junction part). As a result, it is possible to make the avalanche breakdown phenomenon causing the ON operation of the parasitic npn bipolar transistor less likely to occur in the region. Namely, in accordance with the present First Embodiment, it is possible to set high the avalanche breakdown voltage, particularly, in the region in which the parasitic npn bipolar transistor tends to perform an ON operation in the peripheral region PER. As a result, it is possible to avoid the breakage of the power MOSFET due to the avalanche breakdown phenomenon. This can improve the reliability of the semiconductor device including the power MOSFET.

Thus, in the present First Embodiment, a feature also resides in that the higher band gap region HBG is provided in the peripheral region PER. Below, a description will be given to a specific configuration example of the higher band gap region HBG. First, for example, when the epitaxial layer EPI is formed of silicon (Si), the higher band gap region HBG can be formed of a semiconductor region obtained by doping silicon with at least carbon (C). This is for the following reason: for example, as shown in Patent Document 3, when silicon is doped with high-concentration carbon, the band gap is increased. Specifically, in the present First Embodiment, for example, the concentration of carbon is set at 20 mol % or more and 30 mol % or less. As a result, the band gap of the higher band gap region HBG can be made larger than the band gap of silicon. In this case, for example, the band gap of the higher band gap region HBG is about 2.2 eV to 3.3 eV which is larger than the band gap (1.12 eV) of silicon.

<Utility to Superjunction Structure>

Subsequently, a description will be given to the utility of application of the technical idea in the present First Embodiment to a power MOSFET having a superjunction structure. The superjunction structure is a structure in which, even when the impurity concentration of the epitaxial layer EPI (n column region) is set high, the whole epitaxial layer EPI tends to be depleted. Accordingly, it is possible to reduce the ON resistance while ensuring the high breakdown voltage. Therefore, from the viewpoint of achieving sufficient reduction of the ON resistance, with the power MOSFET having a superjunction structure, the impurity concentration of the epitaxial layer EPI is higher than that of a power MOSFET of a common structure. The epitaxial layer EPI is formed not only in the cell region CR but also in the peripheral region PER. For this reason, in the power MOSFET having a superjunction structure, the impurity concentration of the epitaxial layer EPI formed in the peripheral region PER is also higher than that of the power MOSFET of a common structure. Herein, in any structure regardless of a superjunction structure or a common structure, when an avalanche breakdown phenomenon is caused in the peripheral region PER, an avalanche current more concentrates locally than when an avalanche breakdown phenomenon is caused in the cell region CR. Accordingly, the avalanche resistance is exceeded, which makes the power MOSFET more likely to be broken. This indicates the following: useful is the technical idea in the present First Embodiment based on the basic idea that the avalanche breakdown voltage of the peripheral region PER is set higher than the avalanche breakdown voltage of the cell region CR in order to prevent the breakage of the power MOSFET regardless of a superjunction structure or a common structure.

Further, with the superjunction structure, in order to sufficiently reduce the ON resistance, the impurity concentration of the epitaxial layer EPI (n column region) is a higher concentration than that of a common structure. In this regard, the avalanche current based on the avalanche breakdown phenomenon is proportional to the impurity concentration of the epitaxial layer EPI. Accordingly, with the superjunction structure in which the impurity concentration of the epitaxial layer EPI (n column region) is a high concentration, the avalanche current is larger than that of a common structure. As a result, with a superjunction structure, when an avalanche breakdown phenomenon is caused in the peripheral region PER, the avalanche current more concentrates locally than when an avalanche breakdown phenomenon is caused in the cell region CR. In addition to this point, the magnitude of the avalanche current itself caused by the fact that the impurity concentration of the epitaxial layer EPI is a high concentration is also large. By the synergistic factor of these points, the avalanche resistance is exceeded, which makes the power MOSFET more likely to be broken than with a common structure. Therefore, the technical idea in the present First Embodiment based on the basic idea that the avalanche breakdown voltage of the peripheral region PER is set higher than the avalanche breakdown voltage of the cell region CR is usefully applicable particularly to a power MOSFET having a superjunction structure.

Then, in the superjunction structure, p column regions PCR and n column regions are alternately arranged in the epitaxial layer EPI. Accordingly, in the superjunction structure, also in the portion of the epitaxial layer EPI deep along the thickness thereof, a pn junction is formed in the boundary region between the p column region PCR and the n column region. In other words, in the superjunction structure, there are present not only the pn junction (main junction part) formed in the boundary region between the channel region CH and the epitaxial layer EPI in the vicinity of the surface layer region of the epitaxial layer EPI, but also the pn junction (column junction part) formed in the boundary region between the p column region PCR and the n column region in the deep region of the epitaxial layer EPI. For this reason, with the superjunction structure, by providing the lower band gap region LBG in the deep region of the epitaxial layer EPI, it is possible to intentionally reduce the avalanche breakdown voltage of the column junction part. In this case, the column junction part in which the avalanche breakdown voltage has been intentionally reduced is separated sufficiently apart from the element part. Accordingly, the avalanche current flowing through the element part is dispersed. As a result, it is possible to suppress the ON operation of the parasitic npn bipolar transistor in the element part. Namely, in the power MOSFET of a superjunction structure, the column junction part (pn junction) is also present in the deep region. For this reason, a lower band gap region can be formed in the deep region of the epitaxial layer EPI corresponding to the column junction part. As a result, even when an avalanche breakdown phenomenon is caused in the lower band gap region LBG formed in the deep region of the epitaxial layer EPI, it is possible to effectively suppress the ON operation of the parasitic npn bipolar transistor. As a result, with a power MOSFET of a superjunction structure, even when a voltage of more than the power supply voltage is applied to the power MOSFET to cause an avalanche breakdown phenomenon, the power MOSFET can be prevented from coming to be broken. Thus, it is indicated that the technical idea in the present First Embodiment is effectively applicable to, particularly, a power MOSFET having a superjunction structure.

On the other hand, with a power MOSFET of a common structure, the main junction part is formed in the shallow region of the epitaxial layer. However, the pn junction is not formed in the deep region of the epitaxial layer. Accordingly, for a power MOSFET of a common structure, it is considered less significant to form a lower band gap region having a function of intentionally reducing the avalanche breakdown voltage at the pn junction in the deep region of the epitaxial layer as with the power MOSFET of a super junction structure. In other words, with the power MOSFET of a common structure, it is necessary to form a lower band gap region in the shallow region of the epitaxial layer including the main junction part. In this case, as compared with a power MOSFET of a super junction structure, for which it is useful to form the lower band gap region in the deep region of the epitaxial layer, for a power MOSFET of a common structure, the formation is considered less useful for avoiding the breakage of the power MOSFET.

However, even with a power MOSFET of a common structure, provision of the lower band gap region in the cell region CR can provide an effect of suppressing the avalanche breakdown phenomenon in the peripheral region. Accordingly, in order to make the avalanche breakdown voltage of the cell region CR lower than the avalanche breakdown voltage of the peripheral region PER, the lower band gap region is provided in the cell region CR. This basic idea in the present First Embodiment is considered to have a given utility even when applied to a power MOSFET of a common structure.

Whereas, in the present First Embodiment, as a specific configuration example of the lower band gap region LBG formed in the cell region CR, when the epitaxial layer EPI is silicon, the lower band gap region LBG can be formed of a semiconductor region obtained by doping silicon with at least germanium (Ge). When this configuration is applied to a power MOSFET of a superjunction structure, in addition to the basic effects described in connection with the features of First Embodiment, the following secondary effect can also be obtained.

For example, as shown in FIG. 2, in the superjunction structure, there are formed p column regions PCR each formed of a p type semiconductor region. In the cell region CR, the lower band gap region LBG is formed in such a manner as to overlap the p column regions PCR. Herein, the p column region PCR is doped with, for example, boron (B) as a p type impurity; and the lower band gap region LBG is doped with germanium as a lower band gap impurity. Therefore, in the overlap region in which the lower band gap region LBG and the p column region PCR overlap each other, silicon is doped with boron and germanium. Then, germanium has a function of suppressing the diffusion of boron. As a result, the expansion (in the transverse direction of FIG. 2) of the width of the p column region PCR due to diffusion of boron is suppressed in the overlap region. For this reason, for example, in accordance with the present First Embodiment, it is possible to suppress narrowing of the width of the n column region (epitaxial layer EPI) due to expansion of the width of the p column region PCR. In consideration of the fact that the n column region functions as a current path, this means that the current path is suppressed from being narrowed. In other words, this means that the ON resistance is suppressed from being increased. Therefore, in accordance with the present First Embodiment, the lower band gap region LBG is formed of a semiconductor region obtained by doping silicon with at least germanium. When this configuration is applied to a power MOSFET of a superjunction structure, it is also possible to obtain a secondary effect of being capable of suppressing an increase in ON resistance of the power MOSFET.

Modified Example

In the present First Embodiment, a description has been given to the following example: for example, as shown in FIG. 2, in the cell region CR, the lower band gap region LBG is formed in a deeper region than half the depth of the p column region PCR; and in the peripheral region PER, the higher band gap region HBG is formed in a shallower region than half the depth of the p column region PCR. However, the technical idea in the present First Embodiment is not limited to this. For example, there may be adopted only the configuration in which, in the cell region CR, the lower band gap region LBG is formed in a deeper region than half the depth of the p column region PCR. Alternatively, there may be also adopted only the configuration in which, in the peripheral region PER, the higher band gap region HBG is formed in a shallower region than half the depth of the p column region PCR.

Also in this case, it is possible to implement the basic idea that the avalanche breakdown voltage of the peripheral region PER is set higher than the avalanche breakdown voltage of the cell region CR. In other words, also in the present Modified Example, not in the peripheral region PER in which an avalanche current locally concentrates, but in the cell region CR in which an avalanche current does not concentrate locally so much as in the peripheral region PER, an avalanche breakdown phenomenon can be caused. As a result, also in accordance with the present Modified Example, it is possible to effectively prevent the breakage of a power MOSFET due to the avalanche breakdown phenomenon. As a result, it is possible to improve the reliability of a semiconductor device including a power MOSFET.

<Method for Manufacturing a Semiconductor Device>

The semiconductor device in the present First Embodiment is configured as described above. Below, one example of the manufacturing method thereof will be described by reference to the accompanying drawings. The method for manufacturing a semiconductor device in the present First Embodiment is the method for manufacturing a semiconductor device having a cell region, and a peripheral region formed outside the cell region. For example, in the present First Embodiment, a description will be given to a manufacturing method called a so-called "multi-epitaxial method".

Figure 3:
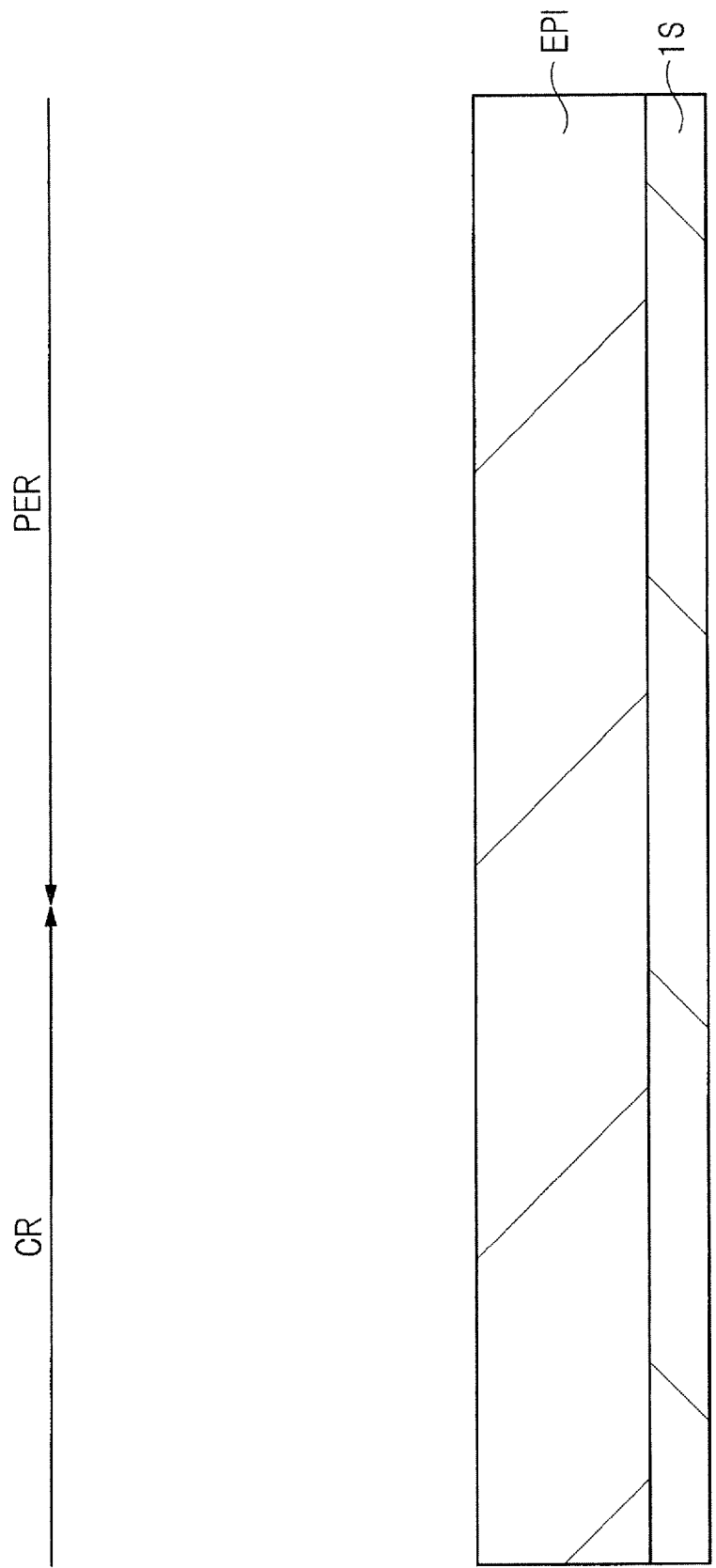
FIG. 3 is a cross sectional view showing a semiconductor device in First Embodiment during a manufacturing step.

First, as shown in FIG. 3, there is provided a semiconductor substrate 1S including an epitaxial layer EPI formed of an n type semiconductor layer over the main surface (front surface or top surface). For example, the semiconductor substrate 1S is formed by doping a single crystal silicon with an n type impurity such as phosphorus (P) or arsenic (As). Further, the impurity concentration of the epitaxial layer EPI is about $1 \times 10^{15}/cm^3$ to $5 \times 10^{15}/cm^3$, for example, when a device with the drain/source breakdown voltage (BVdss) of 200 to 1000 V is assumed. The thickness of the epitaxial layer EPI is about 10 μm to 20 μm at the initial stage.

Figure 4:
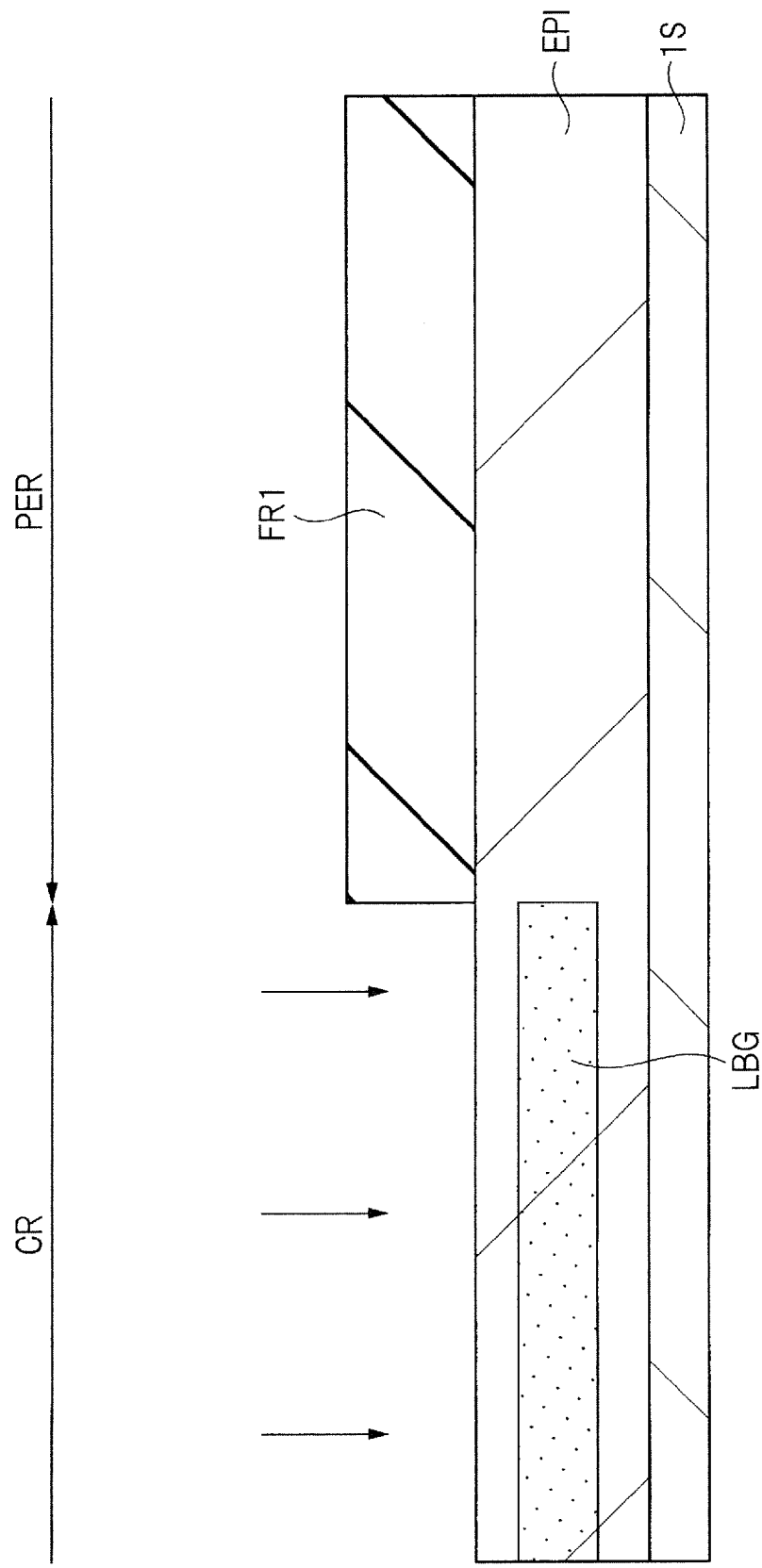
FIG. 4 is a cross sectional view showing the semiconductor device during a manufacturing step following FIG. 3.

Then, as shown in FIG. 4, a resist film FR1 is applied onto the epitaxial layer EPI. Then, the resist film FR1 is subjected to exposure/development treatments, thereby to pattern the resist film FR1. Patterning of the resist film FR1 is performed so that the cell region CR is exposed, and so that the resist film FR1 covers the peripheral region PER. Then, by an ion implantation method using the patterned resist film FR1 as a mask, a lower band gap impurity for making the band gap smaller than the band gap of the epitaxial layer EPI is doped into the inside of the epitaxial layer EPI in the cell region CR. As a result, the lower band gap region LBG is formed in the inside of the epitaxial layer EPI in the cell region CR.

For example, when the epitaxial layer EPI is formed of silicon, as the lower band gap impurities, mention may be made of low-concentration carbon (C) and germanium (Ge). For example, by setting the concentration of carbon at 0.5 mol % or more and 1.0 mol % or less, the band gap of the lower band gap region LBG can be made smaller than the band gap of silicon. On the other hand, the concentration of germanium can be set at 10 mol % or more and 30 mol % or less. Whereas, when the epitaxial layer EPI is formed of silicon carbide (SiC), as the lower band gap impurity, mention may be made of silicon (Si).

Figure 5:
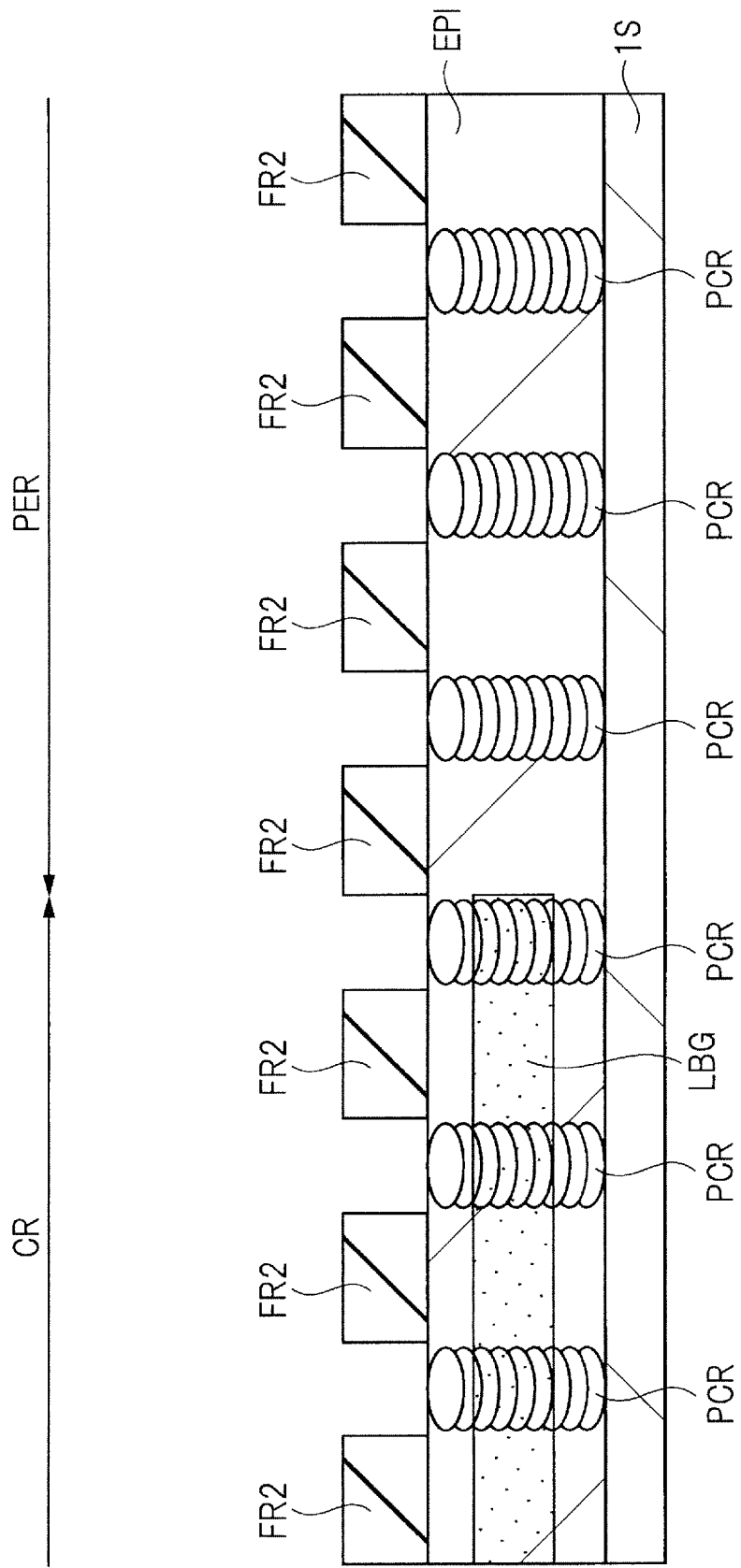
FIG. 5 is a cross sectional view showing the semiconductor device during a manufacturing step following FIG. 4.

Then, the patterned resist film FR1 is removed. Then, as shown in FIG. 5, over the epitaxial layer EPI, there is formed a patterned resist film FR2. Patterning of the resist film FR2 is performed in such a manner as to expose a p column formation region, and to cover the surface of the epitaxial layer EPI in other regions. Then, by an ion implantation method using the patterned resist film FR2 as a mask, for example, boron (B) is doped into the inside of the epitaxial layer EPI extending from the cell region CR to the peripheral region PER. As a result, a plurality of p column regions PCR are formed. Each of the plurality of p column regions PCR is formed in a generally columnar shape extending from the bottom surface to the top surface of the epitaxial layer EPI by, for example, carrying out ion implantation at varying implantation energies a plurality of times. The impurity concentration of the p column region PCR is set so as to achieve the charge balance with the epitaxial layer EPI, and is, for example, about $1 \times 10^{15}/cm^3$ to $5 \times 10^{15}/cm^3$. Then, a plurality of p column regions PCR are formed in such a manner as to be separated from one another. At this step, a partial region of the epitaxial layer EPI interposed between the mutually adjacent p column regions PCR becomes an n column region. As a result, in accordance with the present First Embodiment, in the epitaxial layer EPI, p column regions PCR and n column regions can be alternately formed, resulting in the formation of a superjunction structure.

Figure 6:
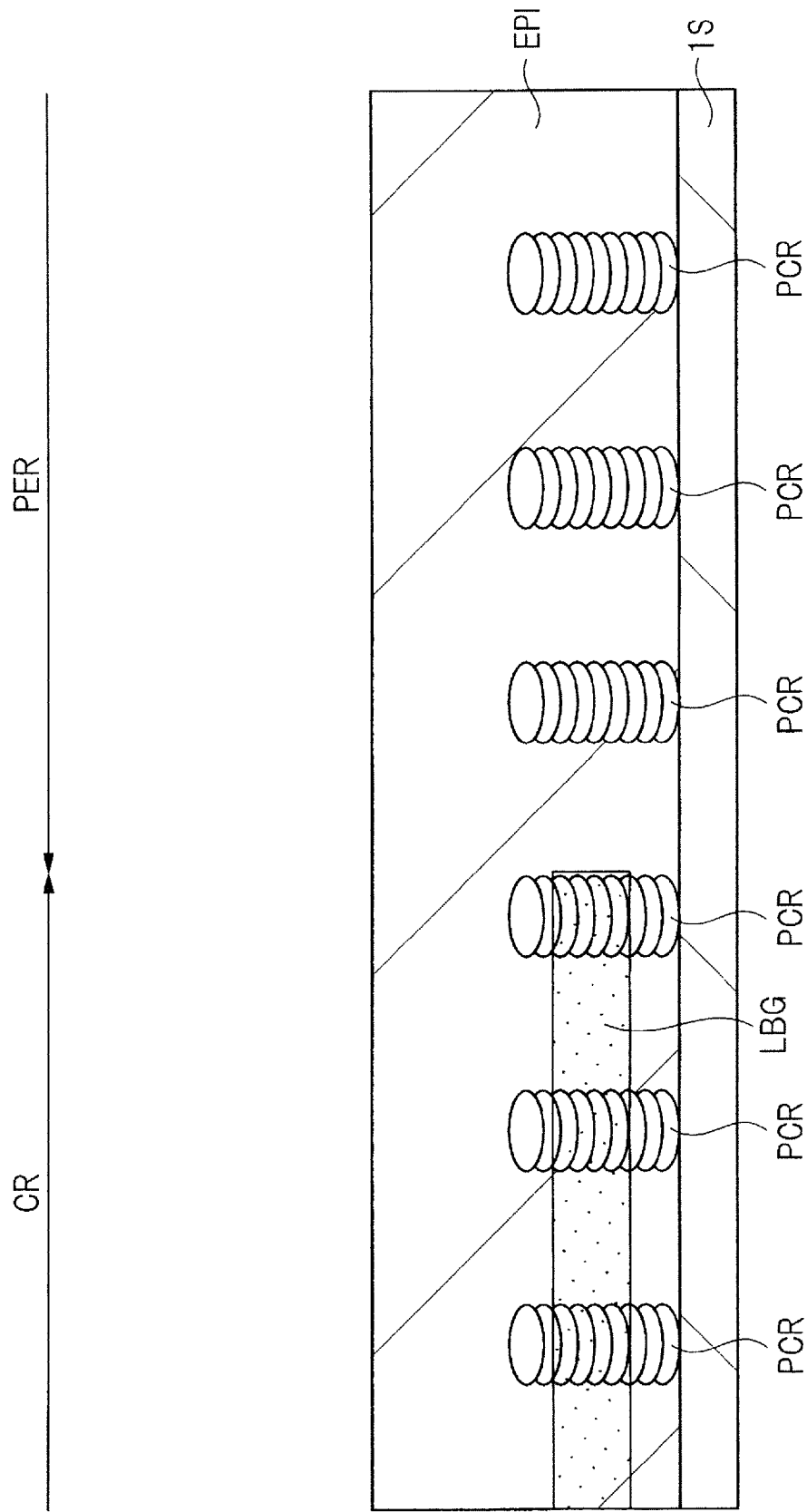
FIG. 6 is a cross sectional view showing the semiconductor device during a manufacturing step following FIG. 5.
Figure 7:
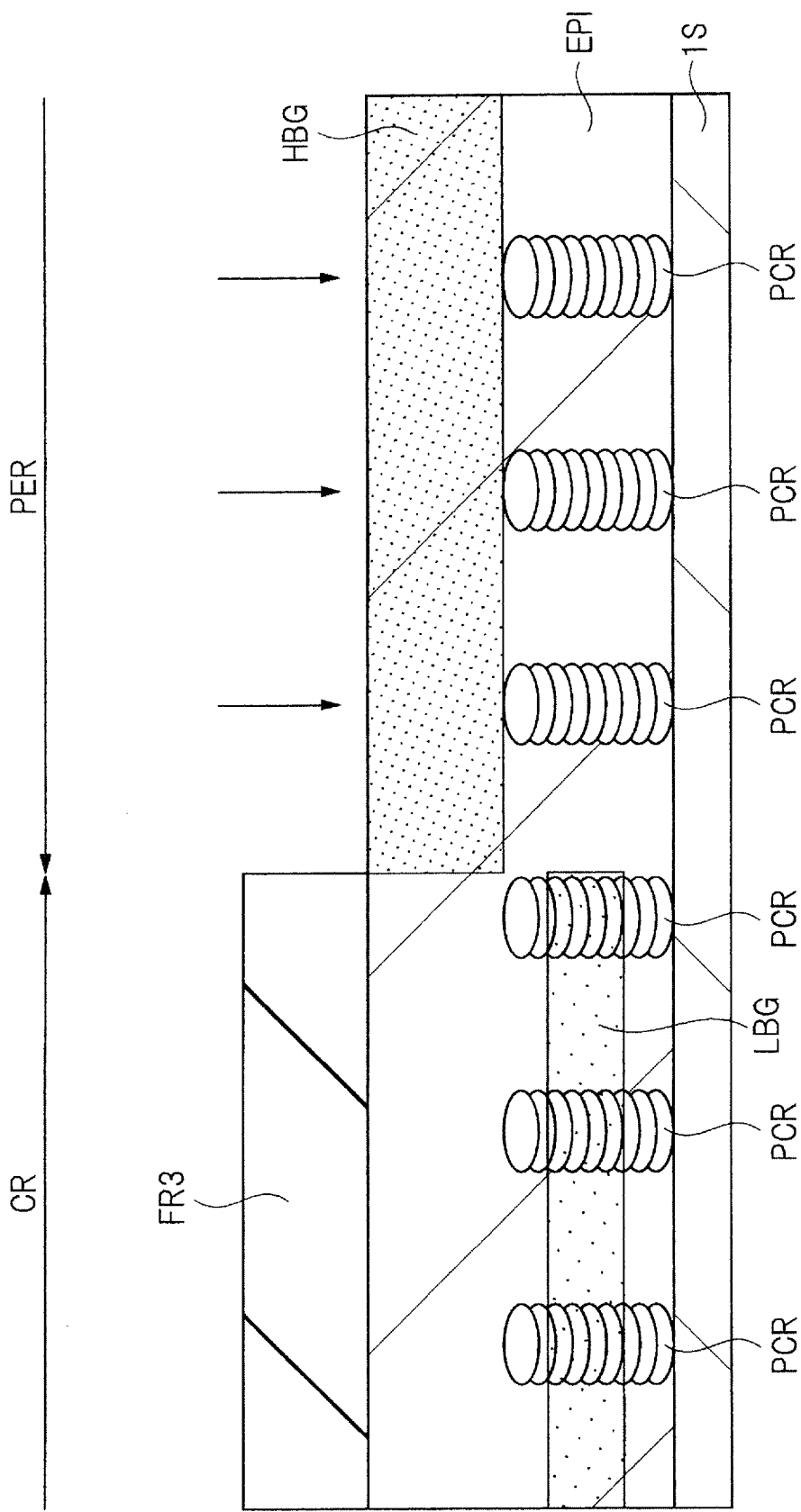
FIG. 7 is a cross sectional view showing the semiconductor device during a manufacturing step following FIG. 6.

Subsequently, as shown in FIG. 6, over the epitaxial layer EPI including the lower band gap region LBG and the p column regions PCR formed therein, there is further formed an epitaxial layer EPI. Then, as shown in FIG. 7, over the top surface of the epitaxial layer EPI, there is formed a patterned resist film FR3. Patterning of the resist film FR3 is performed so as to expose the peripheral region PER, and to cover the cell region CR. Then, by an ion implantation method using the patterned resist film FR3 as a mask, a higher band gap impurity for making the band gap larger than the band gap of the epitaxial layer EPI is doped into the epitaxial layer EPI in the peripheral region PER. As a result, a higher band gap region HBG is formed in the epitaxial layer EPI in the peripheral region PER.

For example, when the epitaxial layer EPI is formed of silicon, as the higher band gap impurity, mention may be made of high-concentration carbon (C). For example, by setting the concentration of carbon at 20 mol % or more and 30 mol % or less, the band gap of the higher band gap region HBG can be made larger than the band gap of silicon.

Figure 8:
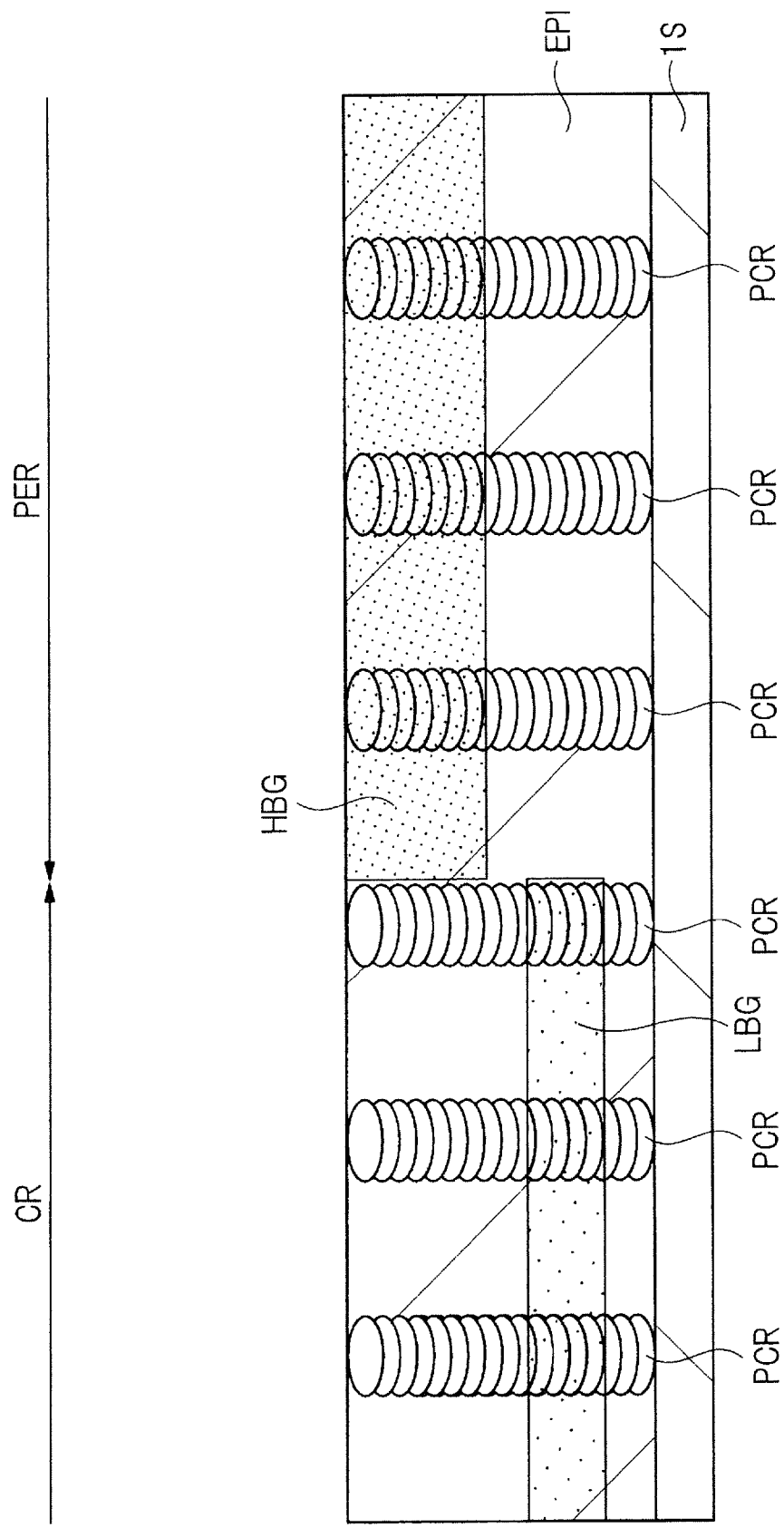
FIG. 8 is a cross sectional view showing the semiconductor device during a manufacturing step following FIG. 7.

Then, as shown in FIG. 8, by using a photolithography technology and an ion implantation method, for example, boron (B) is doped into the epitaxial layer EPI extending from the cell region CR to the peripheral region PER. As a result, a plurality of p column regions PCR are formed. Each of the plurality of p column regions PCR is formed in a generally columnar shape by, for example, carrying out ion implantation at varying implantation energies a plurality of times. Then, the plurality of p column regions PCR are formed in such a manner as to be separated from one another. At this step, each p column region PCR is formed in the upper-layer epitaxial layer EPI so as to be electrically coupled with the corresponding p column region PCR formed in the lower-layer epitaxial layer EPI.

The method in which the epitaxial layer EPI for forming p column regions PCR therein is thus formed in a plurality of divided layers by a plurality of steps is a "multi-epitaxial method". In order to simplify the description of the "multi-epitaxial method", in the present First Embodiment, a description has been given by way of the example in which the epitaxial layer EPI is formed in two divided layers. However, with an actual "multi-epitaxial method", for example, taking a product with a source/drain breakdown voltage (BVdss) of 600 V as an example, the epitaxial layer EPI is formed in 6 to 7 divided layers. Namely, with an actual "multi-epitaxial method", a process of from formation of the epitaxial layer EPI, through a photolithography step, to a boron ion implantation step is repeated about 6 or 7 times, thereby to form a superjunction structure. In other words, with the "multi-epitaxial method", a first epitaxial layer including the p column regions formed therein to the Nth (N is an integer) epitaxial layer including the p column regions formed therein are sequentially formed. As a result, a superjunction structure is formed. In other words, the concentration and the thickness of the n type epitaxial layer EPI are designed according to the breakdown voltage between the source and the drain to be designed. Whereas, the p type ion implantation amount is set so as to achieve the charge balance with the n type epitaxial layer EPI (Qn≈Qp). Further, carbon (carbon) or Ge (germanium) for use in adjustment of the band gap is tetravalent as with Si (silicon), and hence does not affect the charge balance.

Herein, in the cell region CR, the lower band gap region LBG is formed in a deeper region than half the thickness of the lamination region of from each of a plurality of p column regions PCR formed in the first epitaxial layer to each of a plurality of p column regions PCR formed in the Nth epitaxial layer. In other words, in the present First Embodiment, the lower band gap region LBG is formed at a deeper position than half the depth of the p column regions PCR formed throughout the epitaxial layer EPI formed in a lamination.

On the other hand, in the peripheral region PER, the higher band gap region HBG is formed in a shallower region than half the thickness of the lamination region of from each of a plurality of p column regions PCR formed in the first epitaxial layer to each of a plurality of p column regions PCR formed in the Nth epitaxial layer. Namely, in the present First Embodiment, the higher band gap region HBG is formed at a shallower position than half the depth of the p column regions PCR formed throughout the epitaxial layer EPI formed in a lamination.

In the manner described up to this point, in accordance with the present First Embodiment, by the "multi-epitaxial method", a superjunction structure can be formed in the epitaxial layer EPI. Subsequently, a description will be given to a step of forming an element part over the surface of the epitaxial layer EPI including a superjunction structure formed therein.

Figure 9:
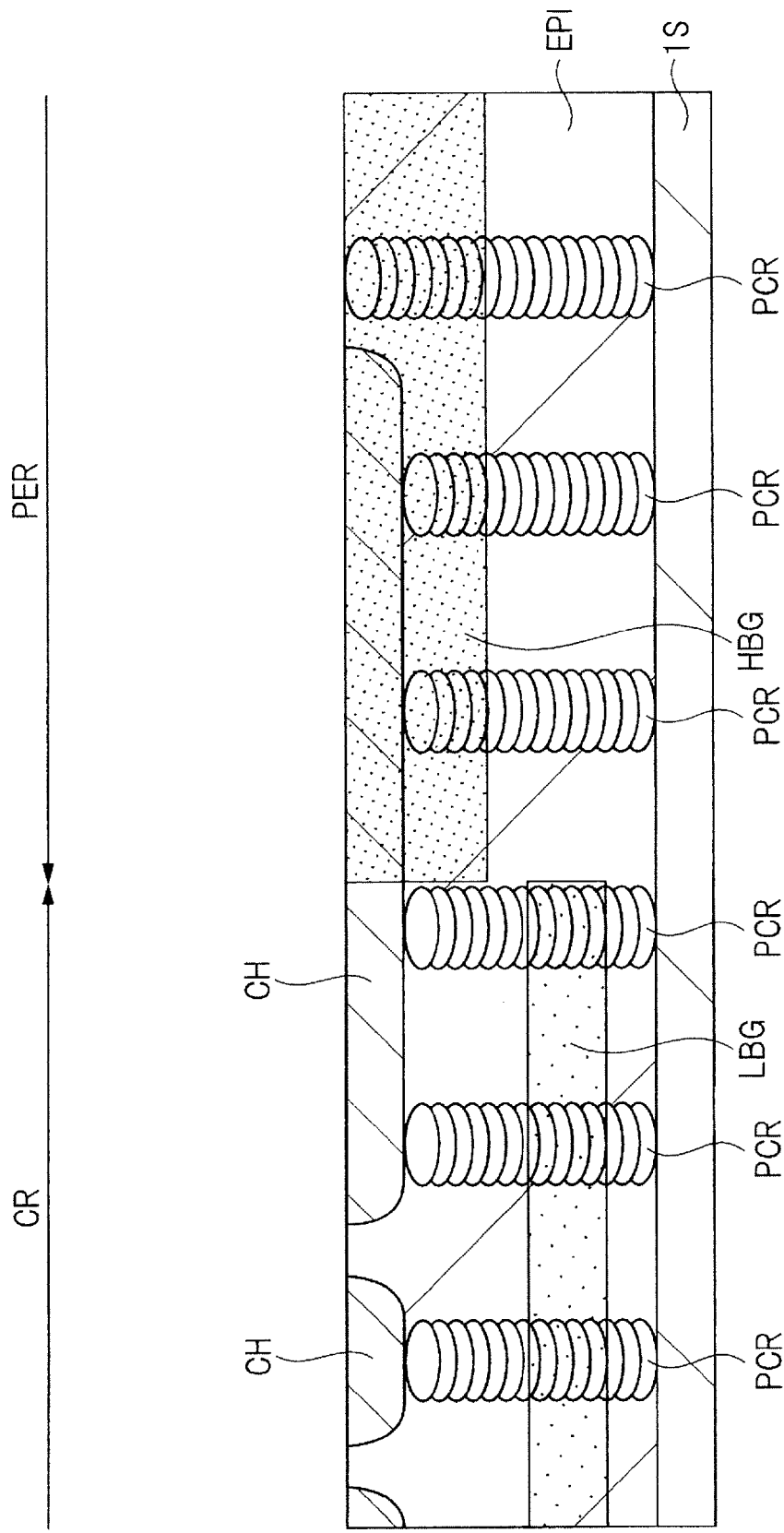
FIG. 9 is a cross sectional view showing the semiconductor device during a manufacturing step following FIG. 8.

First, as shown in FIG. 9, by using a photolithography technology and an ion implantation method, channel regions CH are formed in the cell region CR and the peripheral region PER. The channel region CH is a p type semiconductor region formed by, for example, doping a p type impurity such as boron (B) into the epitaxial layer EPI.

Figure 10:
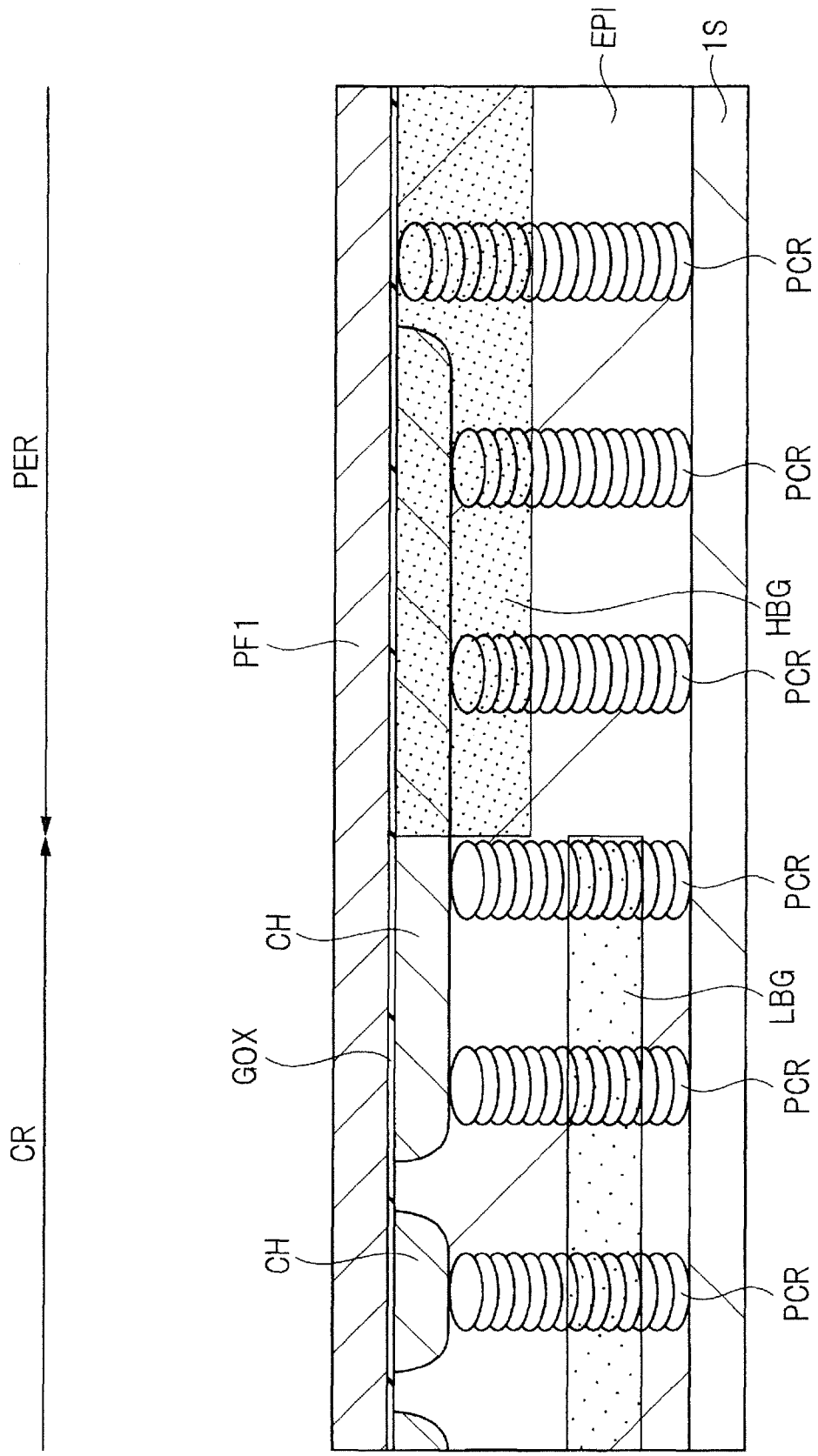
FIG. 10 is a cross sectional view showing the semiconductor device during a manufacturing step following FIG. 9.

Then, as shown in FIG. 10, over the surface of the epitaxial layer EPI, there is formed a gate insulation film GOX. Over the gate insulation film GOX, there is formed a conductor film PF1. The gate insulation film GOX is formed of, for example, a silicon oxide film, and can be formed by, for example, a thermal oxidation method. However, the gate insulation film GOX is not limited to a silicon oxide film, and can also be formed of a high dielectric constant film higher in dielectric constant than a silicon oxide film rep-resented by, for example, a hafnium oxide film. On the other hand, the conductor film PF1 formed over the gate insulation film GOX is formed of, for example, a polysilicon film, and can be formed by using, for example, a CVD (Chemical Vapor Deposition) method.

Figure 11:
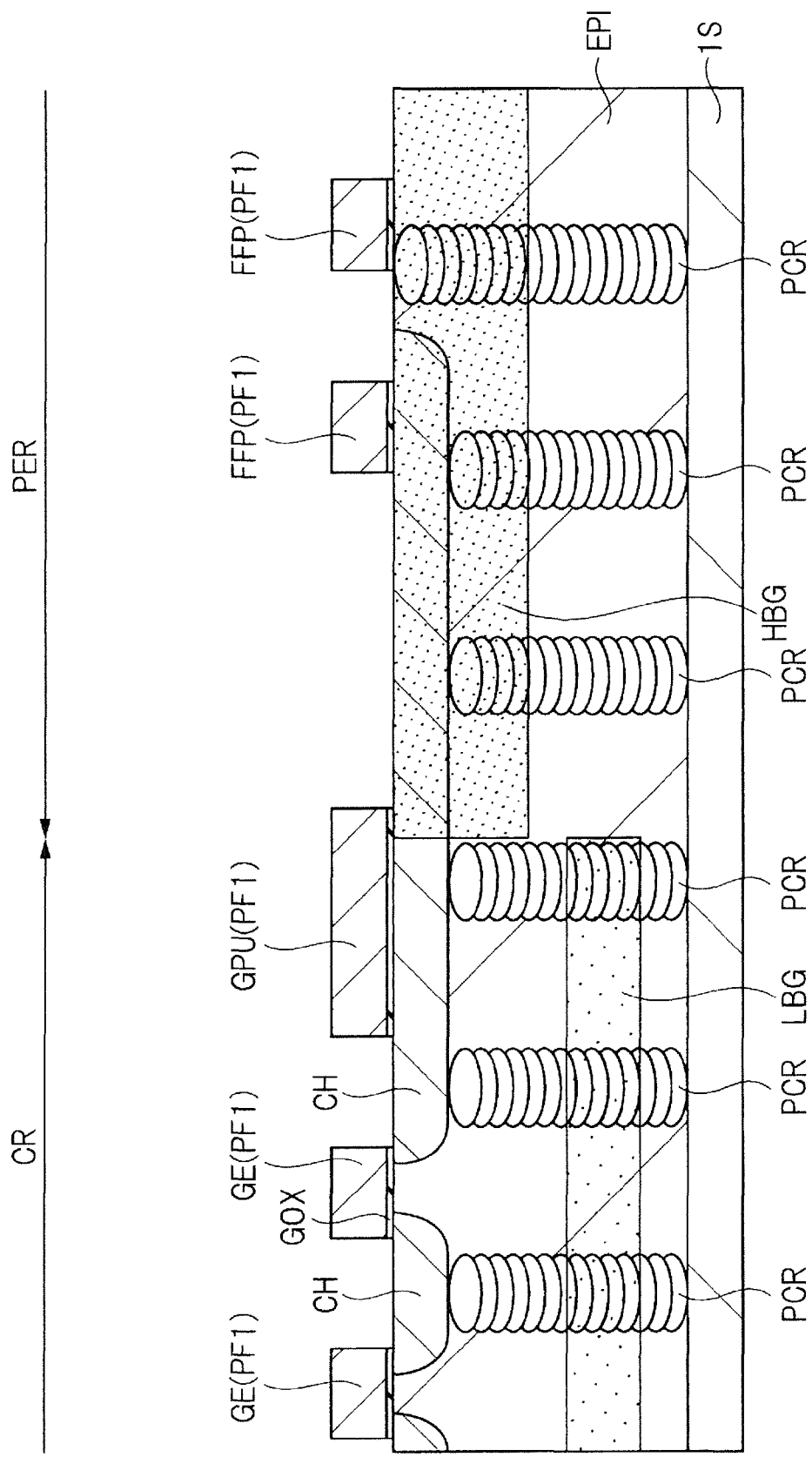
FIG. 11 is a cross sectional view showing the semiconductor device during a manufacturing step following FIG. 10.

Then, as shown in FIG. 11, by using a photolithography technology and an etching technology, the conductor film PF1 is patterned. As a result, in the cell region CR, there are formed a plurality of gate electrodes GE and a gate pull-up part GPU. In the peripheral region PER, there are formed a plurality of electrodes (dummy electrodes) FFP. In the cell region CR, the gate pull-up part GPU is formed in such a manner as to be electrically coupled with a plurality of gate electrodes GE.

Figure 12:
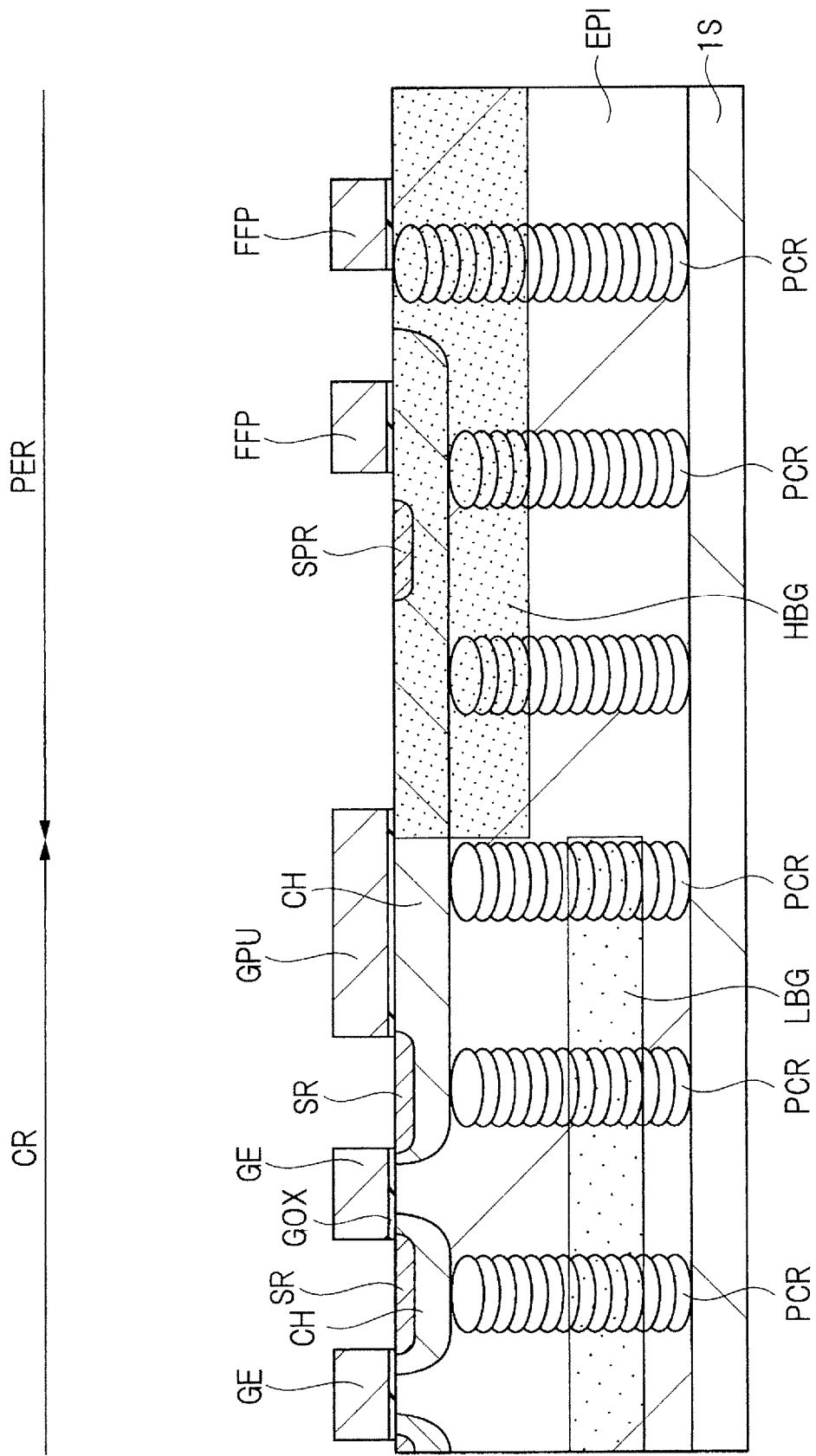
FIG. 12 is a cross sectional view showing the semiconductor device during a manufacturing step following FIG. 11.

Subsequently, as shown in FIG. 12, by using a photolithography technology and an ion implantation method, in the cell region CR, there are formed a plurality of source regions SR in alignment with the gate electrodes GE. In the peripheral region PER, there is formed a source pull-up region SPR. The source region SR and the source pull-up region SPR are each an n type semiconductor region formed by, for example, doping an n type impurity such as phosphorus or arsenic into the epitaxial layer EPI. The plurality of source regions SR formed in the cell region CR are electrically coupled with the source pull-up region SPR formed in the peripheral region PER.

Figure 13:
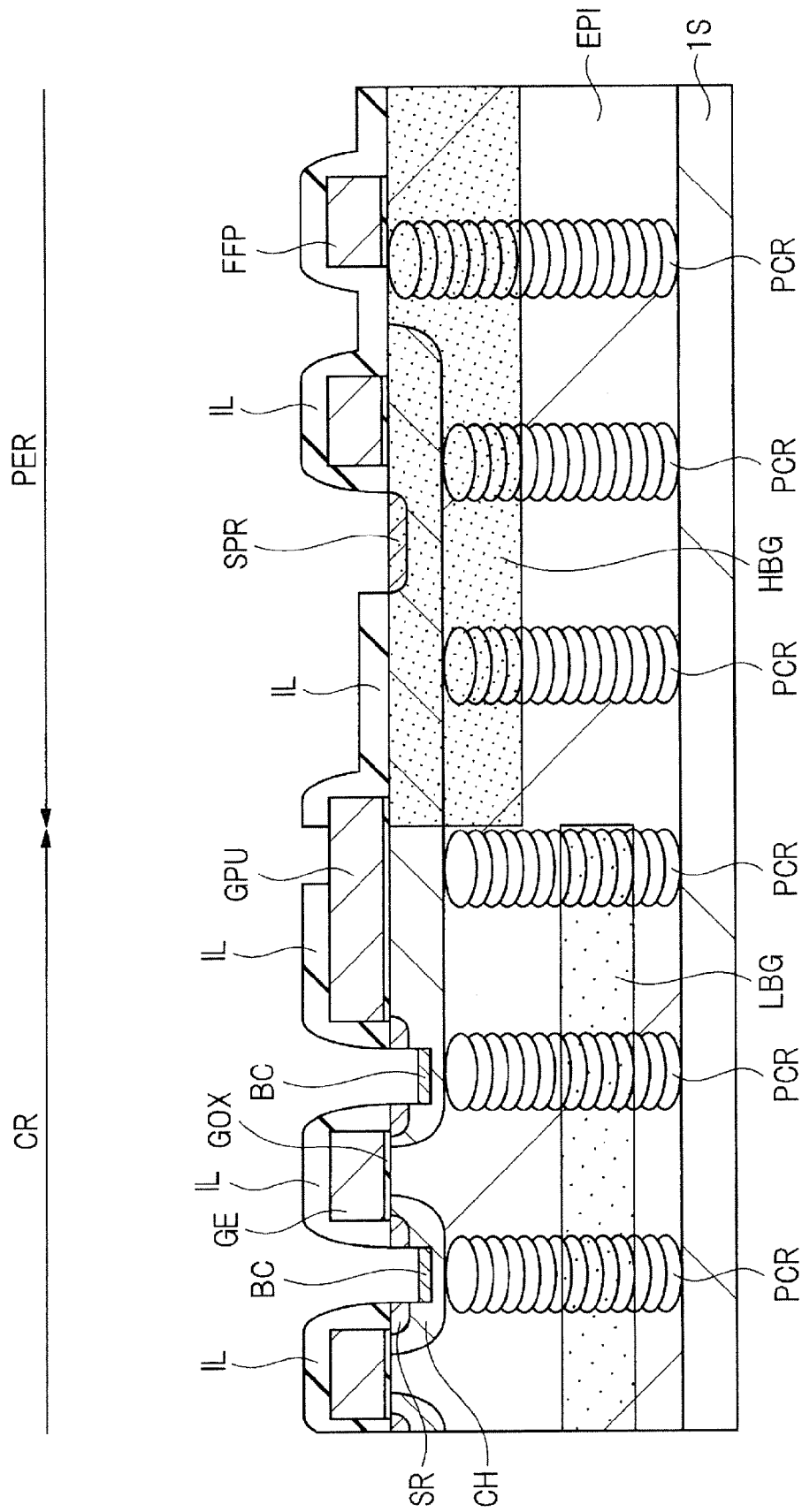
FIG. 13 is a cross sectional view showing the semiconductor device during a manufacturing step following FIG. 12.

Then, as shown in FIG. 13, an interlayer insulation film IL is formed over the epitaxial layer EPI in such a manner as to cover the gate electrodes GE, the gate pull-up part GPU, and the electrode FFP. The interlayer insulation film IL is formed of, for example, a silicon oxide film, and can be formed by using, for example, a CVD method. Then, by using a photolithography technology and an etching technology, there is formed a trench penetrating through the interlayer insulation film IL and the source region SR, and reaching the channel region CH at the bottom thereof between the adjacent gate electrodes GE in the cell region CR. In addition, there is formed an opening for exposing a part of the gate pull-up part GPU. On the other hand, in the peripheral region PER, an opening is formed in the interlayer insulation film IL, thereby to expose the source pull-up region SPR. Then, in the cell region CR, by using a photolithography technology and an ion implantation method, at the bottom of the trench penetrating through the interlayer insulation film IL and the source region SR, and reaching the channel region CH at the bottom thereof, there is formed a body contact region BC. The body contact region BC is a p type semiconductor region formed by doping a p type impurity such as boron (B) into the epitaxial layer EPI, and is formed such that the impurity concentration of the body contact region BC is higher than the impurity concentration of the channel region CH.

Figure 14:
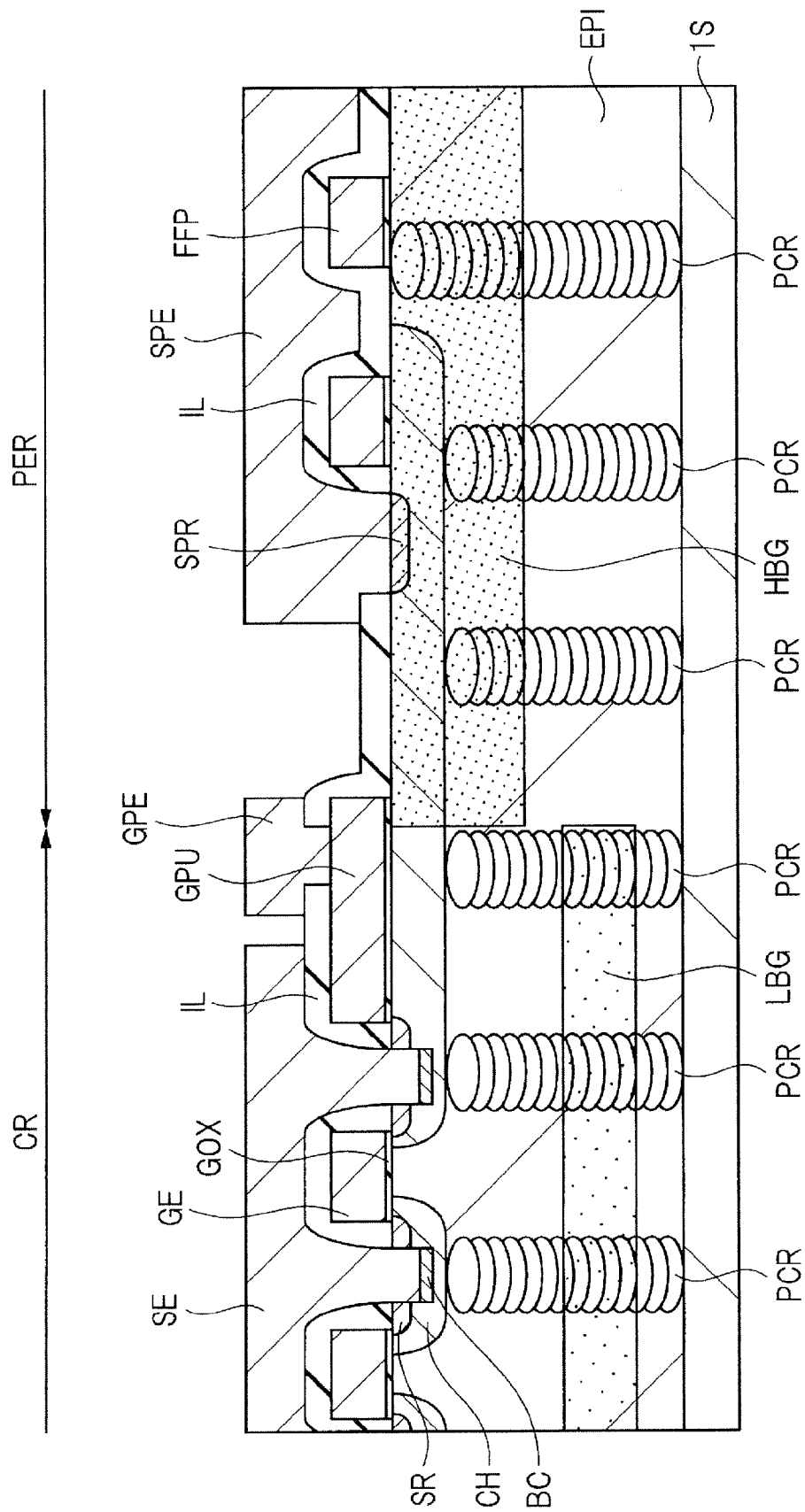
FIG. 14 is a cross sectional view showing the semiconductor device during a manufacturing step following FIG. 13.

Subsequently, as shown in FIG. 14, over the interlayer insulation film IL including the trench including the body contact region BC formed at the bottom thereof, the opening for exposing the gate pull-up part GPU, and the opening for exposing the source pull-up region SPR, there is formed a metal film. The metal film is formed of, for example, a lamination film of a titanium tungsten film, and an aluminum film, and can be formed by using, for example, a sputtering method. Then, by using a photolithography technology and an etching technology, the metal film is patterned. As a result, in the cell region CR, there is formed a source electrode SE electrically coupled with the source region SR and the body contact region BC, and there is formed the gate pull-up electrode GPE electrically coupled with the gate pull-up part GPU. On the other hand, in the peripheral region PER, there is formed a source pull-up electrode SPE electrically coupled with the source pull-up region SPR.

Then, as shown in FIG. 2, a surface protective film PAS is formed in such a manner as to cover the source electrode SE, the gate pull-up electrode GPE, and the source pull-up electrode SPE. Then, by using a photolithography technology and an etching technology, the surface protective film PAS is patterned, thereby to expose a partial region of the source electrode SE, a partial region of the gate pull-up electrode GPE, and a partial region of the source pull-up electrode SPE from the surface protective film PAS. This allows the regions exposed from the surface protective film PAS to function as external coupling regions. In the manner described up to this point, it is possible to manufacture the semiconductor device in the present First Embodiment.

<Advantage of Multi-Epitaxial Method>

In the present First Embodiment, with the "multi-epitaxial method", a superjunction structure is formed in the epitaxial layer EPI. In accordance with the "multi-epitaxial method", it is possible to obtain the following advantage. For example, when a thick epitaxial layer EPI has been previously formed, it becomes difficult to form a lower band gap region LBG in a deep region of the cell region CR. This is for the following reason: for example, the lower band gap region LBG is formed by doping a lower band gap impurity into the epitaxial layer EPI by an ion implantation method; however, when the epitaxial layer EPI has been previously increased in thickness, the implantation energy in the ion implantation method must be increased, which is difficult to implement.

In contrast, with the "multi-epitaxial method" used in the present First Embodiment, the epitaxial layer EPI is formed in a plurality of divided layers by a plurality of steps. For this reason, it is possible to readily achieve doping of the lower band gap impurity in the epitaxial layer first formed at the initial stage in a plurality of layers. Namely, with the "multi-epitaxial method", at the stage of having formed the epitaxial layer at the initial stage to be a deep layer of a plurality of epitaxial layers, an ion implantation method for doping a lower band gap impurity is carried out. As a result, the lower band gap region LBG can be formed in the epitaxial layer at the initial stage. Then, with the "multi-epitaxial method", over the epitaxial layer including the lower band gap region LBG formed therein, a plurality of epitaxial layers are formed in a lamination. Resultantly, it is possible to form the lower band gap region LBG in a deep region of the whole epitaxial layers. From the description up to this point, the "multi-epitaxial method" has an advantage of being capable of readily implementing the lower band gap region LBG which is the feature of the present First Embodiment.

Second Embodiment

In the First Embodiment, a description has been given to the example in which a novel technical idea is applied to the power MOSFET having a superjunction structure formed by the "multi-epitaxial method". In the present Second Embodiment, a description will be given to an example in which a novel technical idea is applied to a power MOSFET having a superjunction structure formed by a "trench fill method".

<Configuration of Semiconductor Device>

Figure 15:
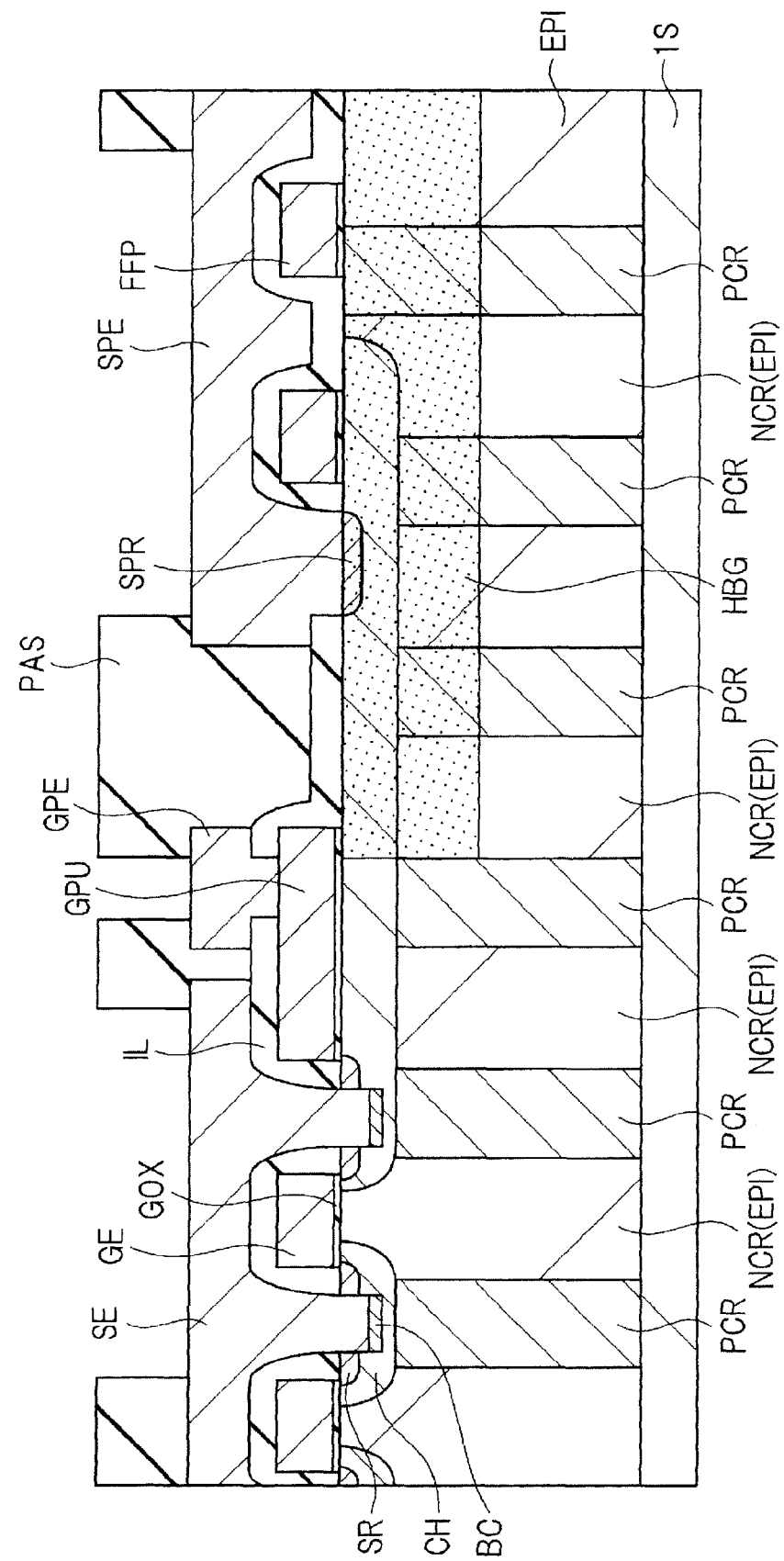
FIG. 15 is a cross sectional view showing a configuration of a semiconductor device in Second Embodiment.

FIG. 15 is a cross sectional view showing a configuration of a semiconductor device (power MOSFET) in the present Second Embodiment. The configuration of the power MOSFET in the present Second Embodiment shown in FIG. 15 is roughly the same as the configuration of the power MOSFET in the First Embodiment shown in FIG. 2, and hence differences will be mainly described.

In FIG. 15, the power MOSFET in the present Second Embodiment is different from the power MOSFET in First Embodiment (see FIG. 2) in which the p column region PCR is formed by an ion implantation method in that a plurality of p column regions PCR formed in the epitaxial layer EPI are each formed by filling a p type semiconductor film in the trench. However, the functions of the resulting p column regions PCR themselves are the same.

Then, in the power MOSFET in the present Second Embodiment, the lower band gap region LBG is not formed in the cell region CR because the "trench fill method" is used for the method for manufacturing a power MOSFET. However, in the peripheral region PER, as with the First Embodiment, the higher band gap region HBG is formed. In other words, also in the present Second Embodiment, in the peripheral region PER, a higher band gap region HBG having a larger band gap than the band gap of the epitaxial layer EPI is formed in a shallower region than half the depth of the p column region PCR.

As a result, also in the present Second Embodiment, for example, even when the power MOSFET is applied with a voltage equal to or larger than the power supply voltage under the influence of the inductance included in the load, without causing an avalanche breakdown phenomenon in the peripheral region PER, an avalanche breakdown phenomenon can be caused in the cell region CR. In other words, also with the power MOSFET in the present Second Embodiment, the higher band gap region HBG having a high avalanche breakdown voltage is formed in the peripheral region PER. As a result, without causing an avalanche breakdown phenomenon in the peripheral region PER, it is possible to cause an avalanche breakdown phenomenon in the cell region CR.

Accordingly, also in the present Second Embodiment, it is possible to effectively suppress the occurrence of an avalanche breakdown phenomenon in the peripheral region PER in which an avalanche current locally concentrates. As a result, the power MOSFET can be prevented from being broken due to exceeding of the avalanche resistance of the power MOSFET. Consequently, also with the power MOSFET in the present Second Embodiment, even when the power MOSFET is applied with a voltage exceeding the power supply voltage to cause an avalanche breakdown phenomenon, the situation leading to breakage of the power MOSFET can be avoided. For this reason, also in accordance with the present Second Embodiment, it is possible to improve the reliability of the semiconductor device including a power MOSFET.

<Method for Manufacturing a Semiconductor Device>

The semiconductor device in the present Second Embodiment is configured as described above. Below, one example of the manufacturing method thereof will be described by reference to the accompanying drawings. The method for manufacturing a semiconductor device in the present Second Embodiment is a method for manufacturing a semiconductor device having a cell region, and a peripheral region formed outside the cell region. For example, in the present Second Embodiment, a description will be given to a manufacturing method called a so-called "trench fill method".

Figure 16:
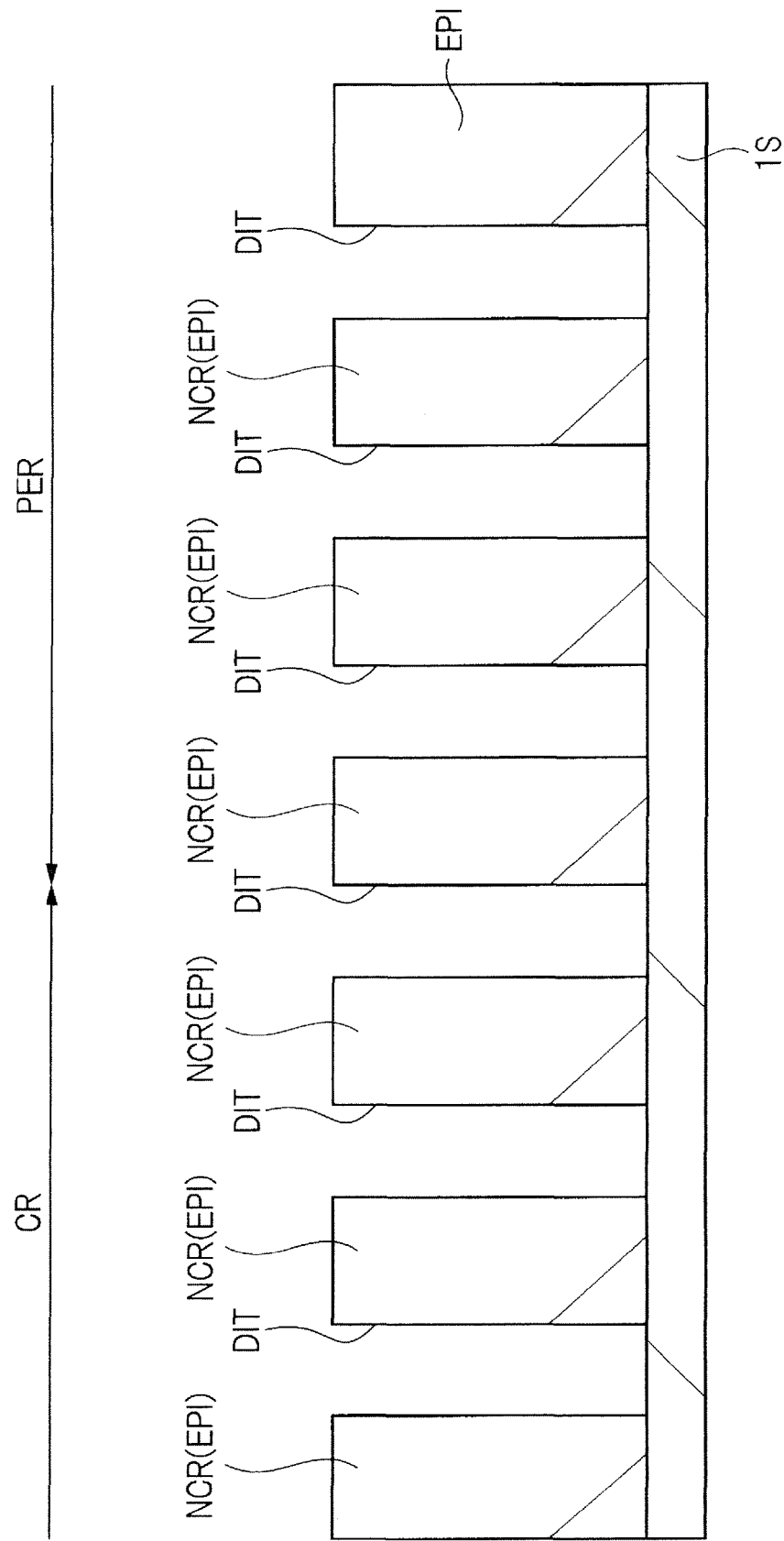
FIG. 16 is a cross sectional view showing the semiconductor device in Second Embodiment during a manufacturing step.

First, as shown in FIG. 16, there is provided a semiconductor substrate 1S including an epitaxial layer EPI formed of an n type semiconductor layer formed over the main surface. At this step, for example, in the case of a product with a breakdown voltage of about 600 V, the impurity concentration of the epitaxial layer EPI is, for example, about $1 \times 10^{15}/cm^3$ to $5 \times 10^{15}/cm^3$. The thickness of the epitaxial layer EPI is about 40 µm to 50 µm. Then, by using a photolithography technology and an etching technology, a plurality of trenches (trenches) DIT are formed in the epitaxial layer EPI extending from the cell region CR to the peripheral region PER. At this step, the taper angle of the trench DIT is, for example, about 88.0 degrees to 90 degrees. At this step, the partial region of the epitaxial layer EPI interposed between the adjacent trenches DIT becomes an n column region NCR.

Figure 17:
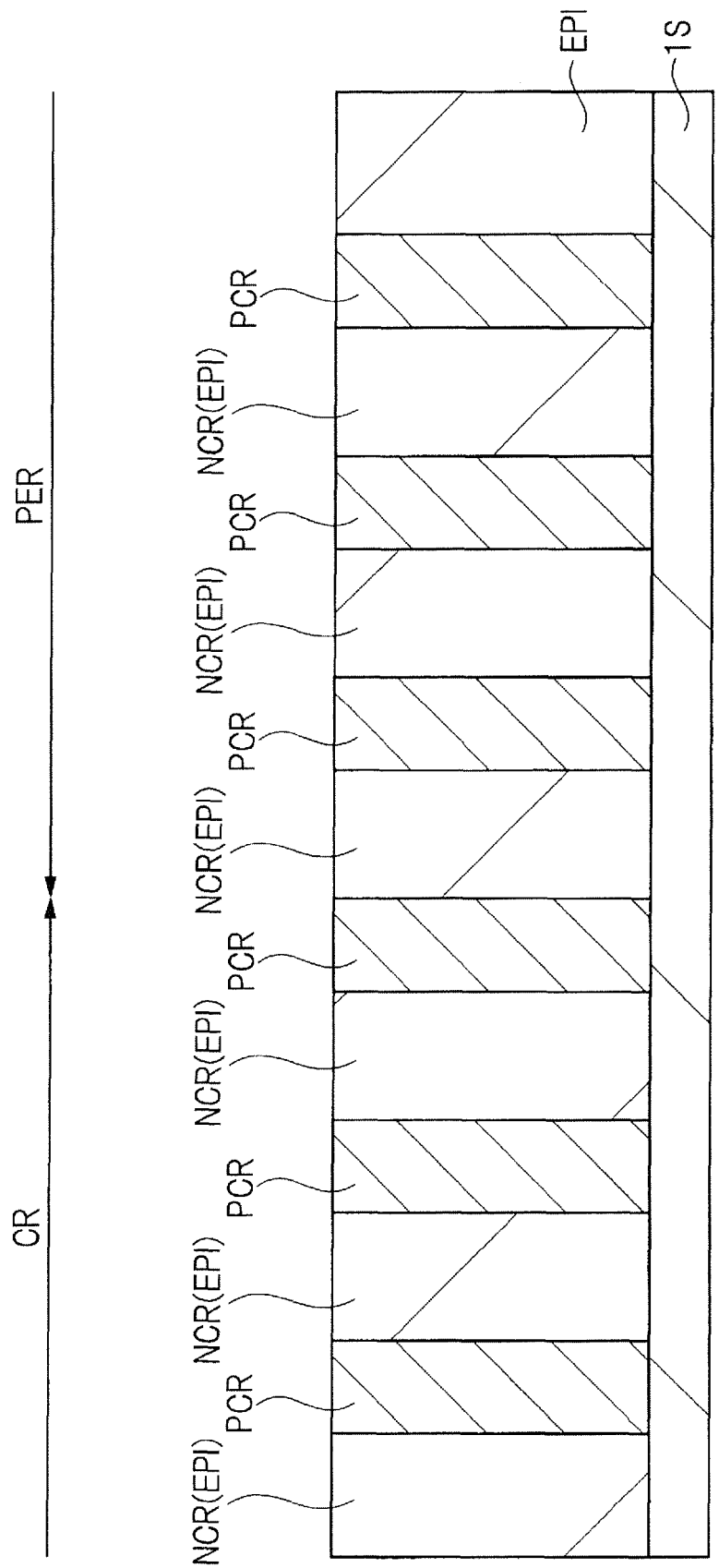
FIG. 17 is a cross sectional view showing the semiconductor device during a manufacturing step following FIG. 16.

Then, as shown in FIG. 17, for example, in the inside of the trench DIT formed in the epitaxial layer EPI by a filling epitaxial growth method, there is formed a p column region PCR formed of a p type semiconductor region. The method in which a plurality of trenches DIT separated from one another are thus formed in the epitaxial layer EPI, and p column regions PCR are formed in the trenches, respectively, is the "trench fill method". By the "trench fill method", in accordance with the present Second Embodiment, p column region PCR and n column regions NCR can be alternately formed in the epitaxial layer EPI. As a result, a superjunction structure can be formed.

Figure 18:
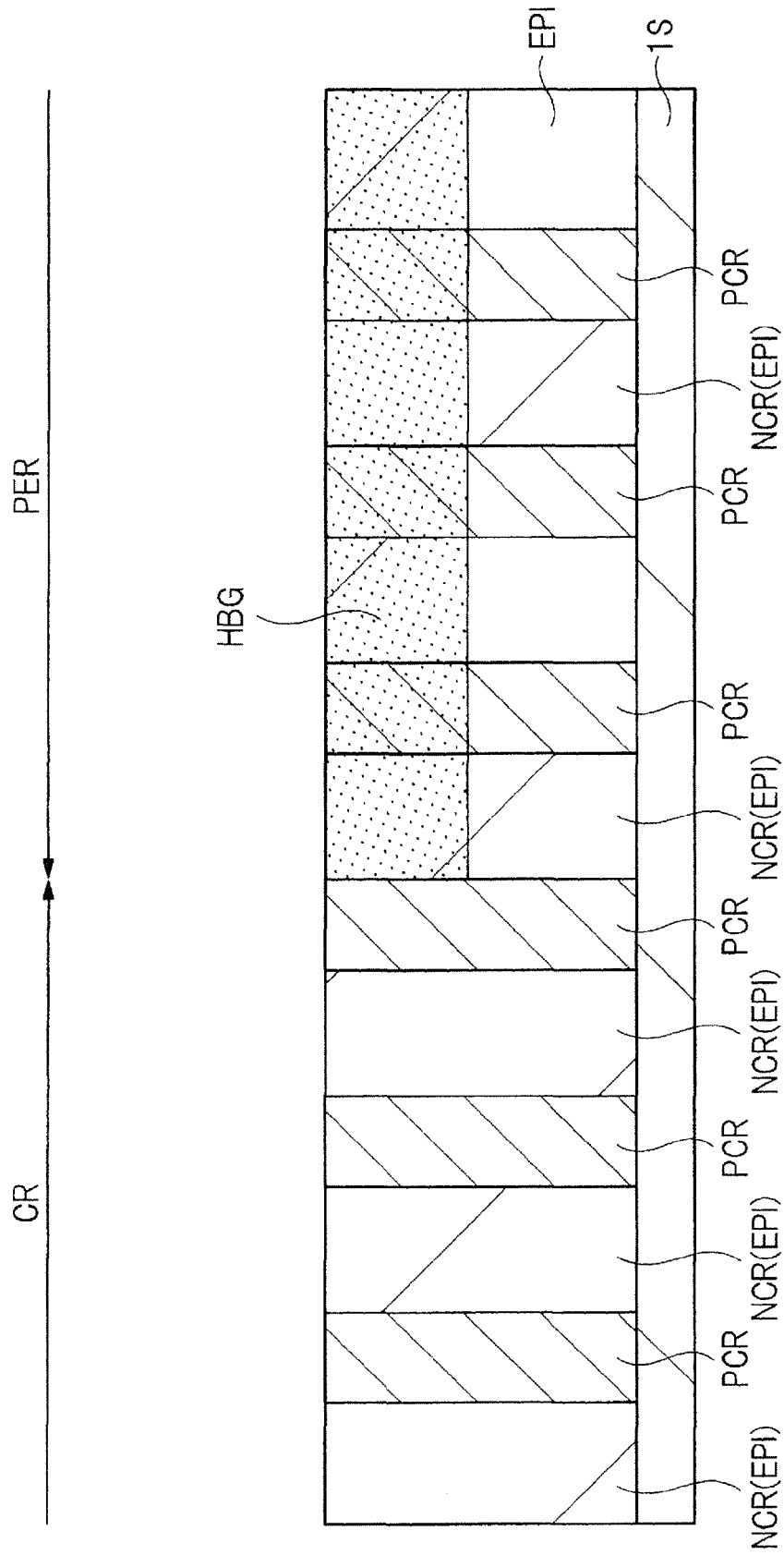
FIG. 18 is a cross sectional view showing the semiconductor device during a manufacturing step following FIG. 17.

Subsequently, as shown in FIG. 18, by using a photolithography technology and an ion implantation method, a higher band gap impurity for making the band gap larger than the band gap of the epitaxial layer EPI is doped into the epitaxial layer EPI in the peripheral region PER. As a result, a higher band gap region HBG is formed in the epitaxial layer EPI in the peripheral region PER.

For example, when the epitaxial layer EPI is formed of silicon, as the higher band gap impurity, mention may be made of high-concentration carbon (C). For example, by setting the concentration of carbon at 20 mol % or more and 30 mol % or less, the band gap of the higher band gap region HBG can be made larger than the band gap of the silicon. Herein, in the peripheral region PER, the higher band gap region HBG is formed in a shallower region than half the depth of the p column region PCR formed in the trench DIT.

Figure 19:
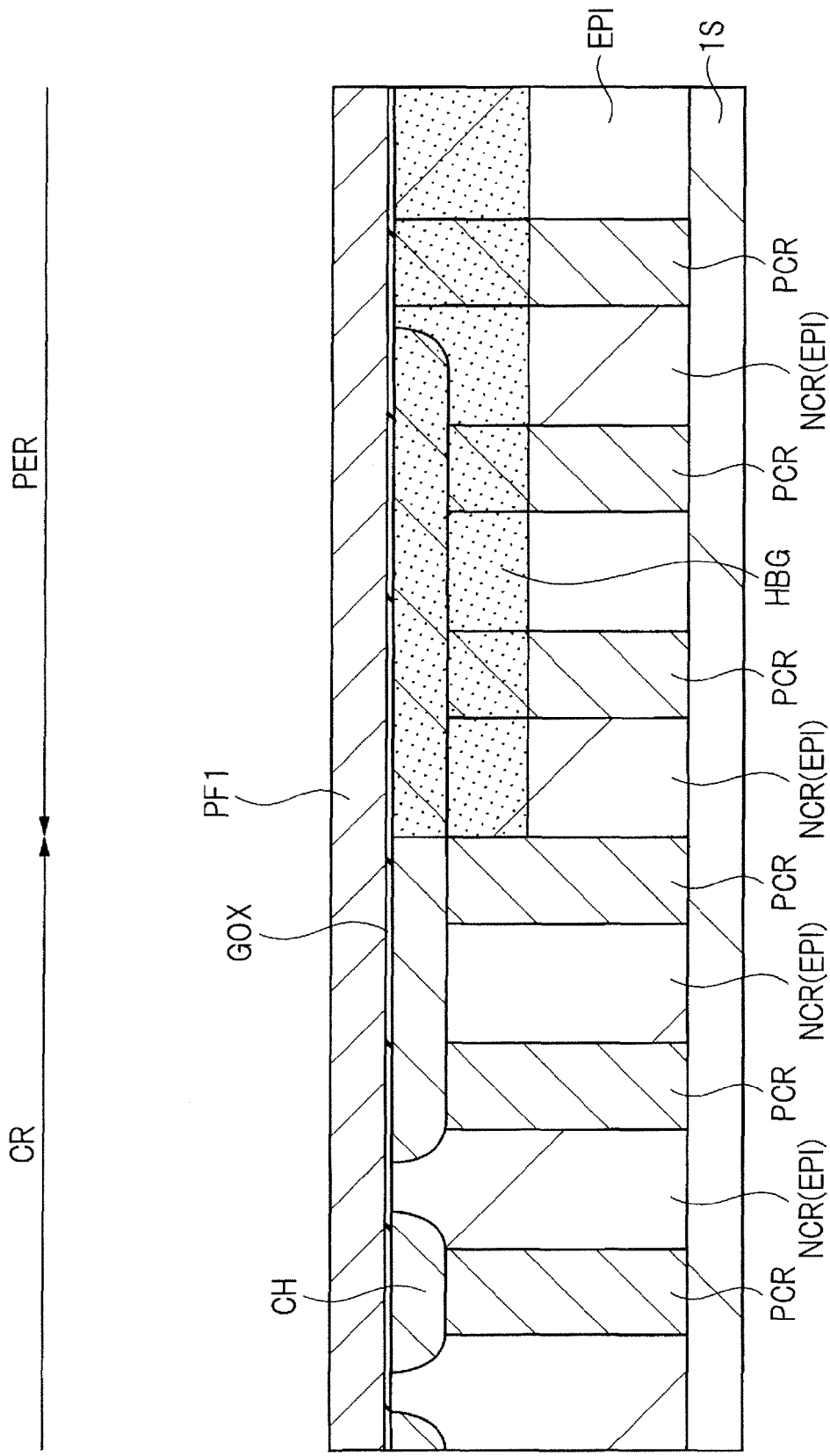
FIG. 19 is a cross sectional view showing the semiconductor device during a manufacturing step following FIG. 18.

Then, a description will be given to a step of forming an element part over the surface of the epitaxial layer EPI including a super junction structure formed therein. First, as shown in FIG. 19, by using a photolithography technology and an ion implantation method, channel regions CH are formed in the cell region CR and the peripheral region PER. The channel region CH is a p type semiconductor region formed by, for example, doping a p type impurity such as boron (B) into the epitaxial layer EPI.

Then, over the surface of the epitaxial layer EPI, there is formed a gate insulation film GOX. Over the gate insulation film GOX, there is formed a conductor film PF1. The gate insulation film GOX is formed of, for example, a silicon oxide film, and can be formed by, for example, a thermal oxidation method. However, the gate insulation film GOX is not limited to a silicon oxide film, and can also be formed of a high dielectric constant film higher in dielectric constant than a silicon oxide film represented by, for example, a hafnium oxide film. On the other hand, the conductor film PF1 formed over the gate insulation film GOX is formed of, for example, a polysilicon film, and can be formed by using, for example, a CVD method.

Figure 20:
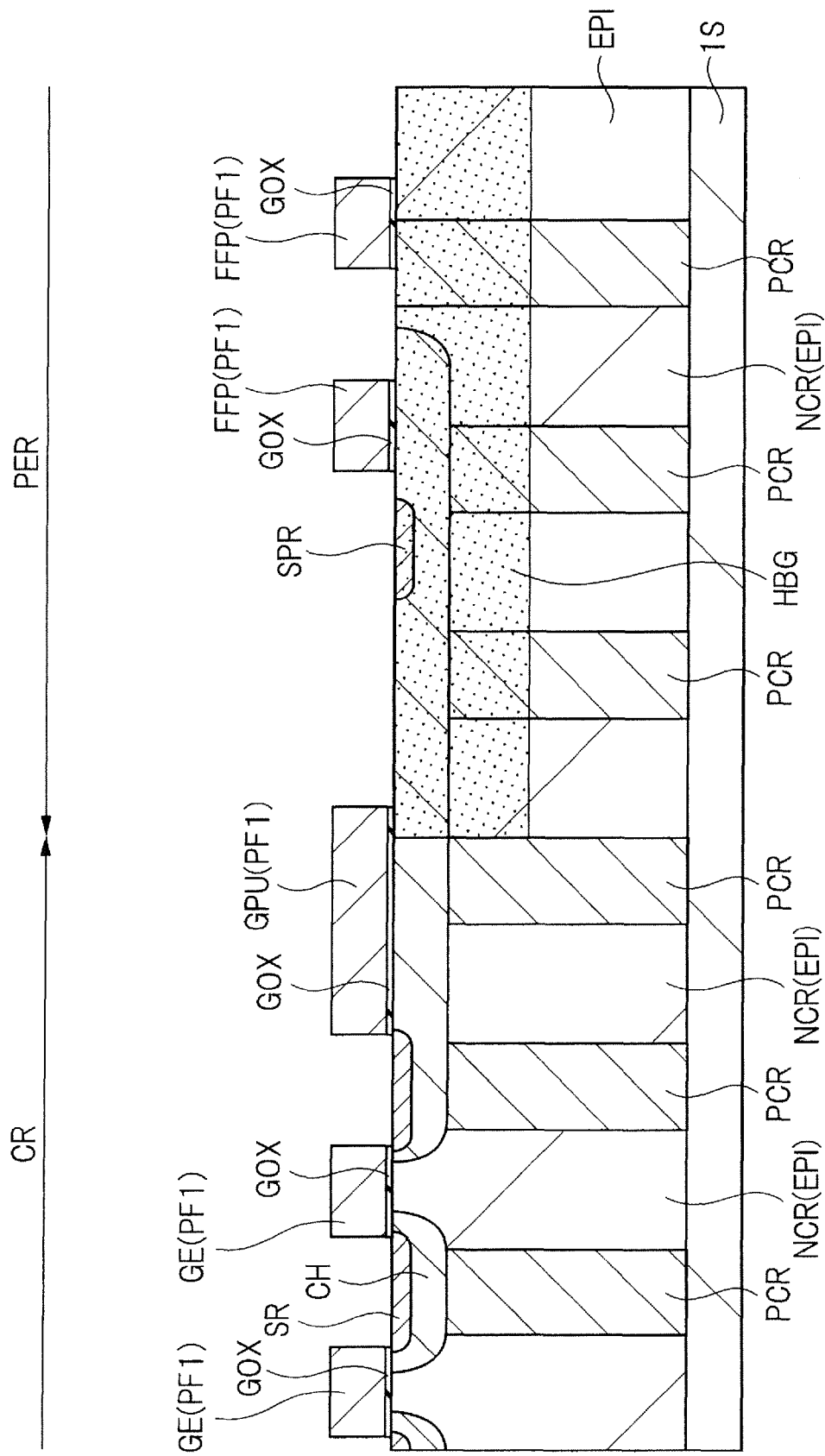
FIG. 20 is a cross sectional view showing the semiconductor device during a manufacturing step following FIG. 19.

Subsequently, as shown in FIG. 20, by using a photolithography technology and an etching technology, the conductor film PF1 is patterned. As a result, in the cell region CR, a plurality of gate electrodes GE and the gate pull-up part GPU are formed. In the peripheral region PER, there are formed a plurality of electrodes (dummy electrodes) FFP. In the cell region CR, the gate pull-up part GPU is formed in such a manner as to be electrically coupled with a plurality of gate electrodes GE.

Figure 21:
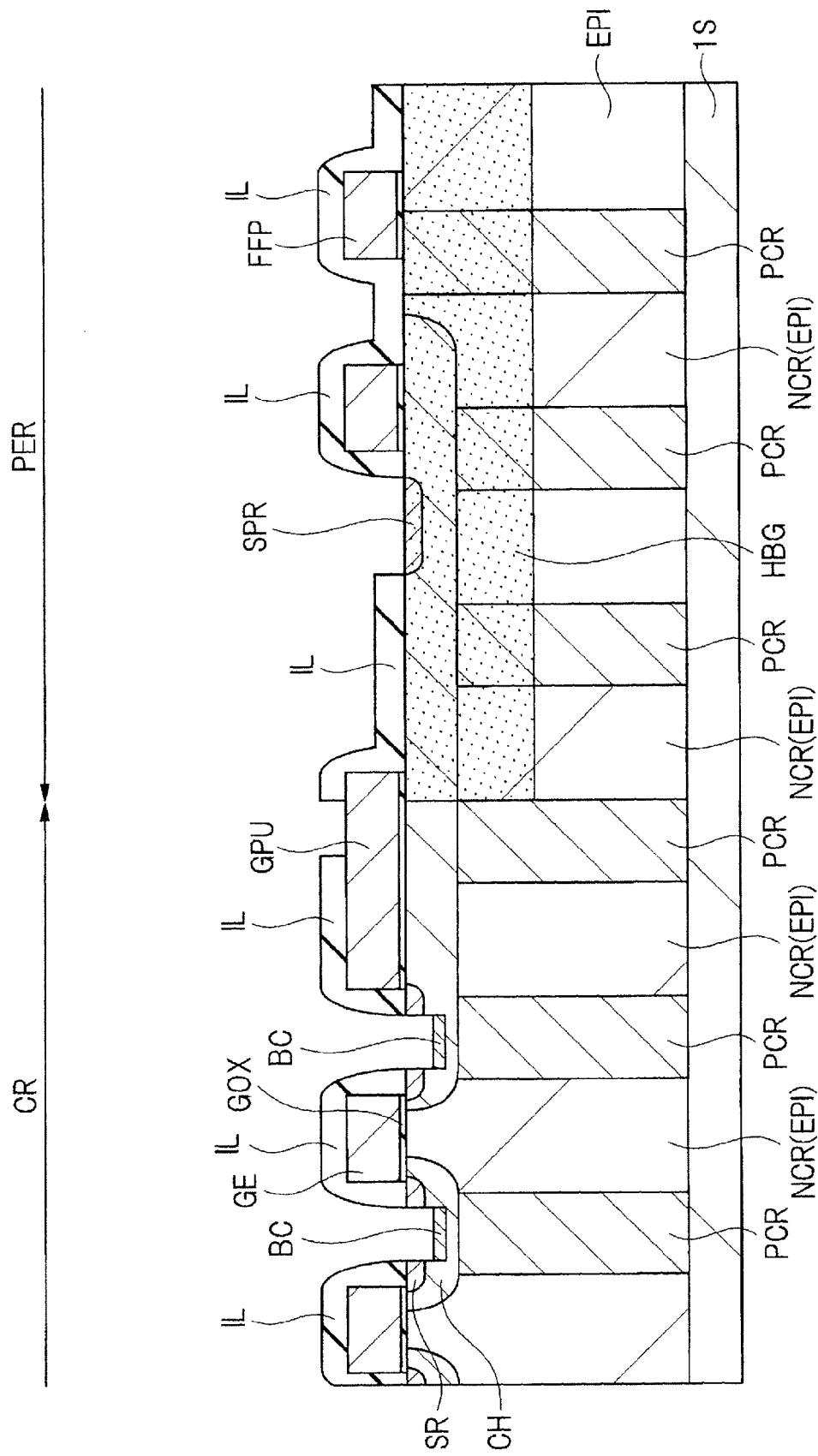
FIG. 21 is a cross sectional view showing the semiconductor device during a manufacturing step following FIG. 20.

Then, as shown in FIG. 21, by using a photolithography technology and an ion implantation method, in the cell region CR, there are formed a plurality of source regions SR in alignment with the gate electrodes GE, respectively. In the peripheral region PER, a source pull-up region SPR is formed. The source regions SR and the source pull-up region SPR are each an n type semiconductor region formed by, for example, doping an n type impurity such as phosphorus or arsenic into the epitaxial layer EPI. The plurality of source regions SR formed in the cell region CR are electrically coupled with the source pull-up region SPR formed in the peripheral region PER.

Then, over the epitaxial layer EPI covering the gate electrodes GE, the gate pull-up part GPU, and the electrodes FFP, there is formed an interlayer insulation film IL. The interlayer insulation film IL is formed of, for example, a silicon oxide film, and can be formed by using, for example, a CVD method. Then, by using a photolithography technology and an etching technology, there is formed a trench penetrating through the interlayer insulation film IL and the source region SR, and reaching the channel region CH at the bottom thereof between the adjacent gate electrodes GE in the cell region CR. In addition, there is formed an opening for exposing a part of the gate pull-up part GPU. On the other hand, in the peripheral region PER, there is formed an opening in the interlayer insulation film IL, thereby to expose the source pull-up region SPR. Then, in the cell region CR, by using a photolithography technology and an ion implantation method, at the bottom of the trench penetrating through the interlayer insulation film IL and the source region SR, and reaching the channel region CH at the bottom thereof, there is formed a body contact region BC. The body contact region BC is a is a p type semiconductor region formed by doping a p type impurity such as boron (B) into the epitaxial layer EPI, and is formed so that the impurity concentration of the body contact region BC is higher than the impurity concentration of the channel region CH.

Figure 22:
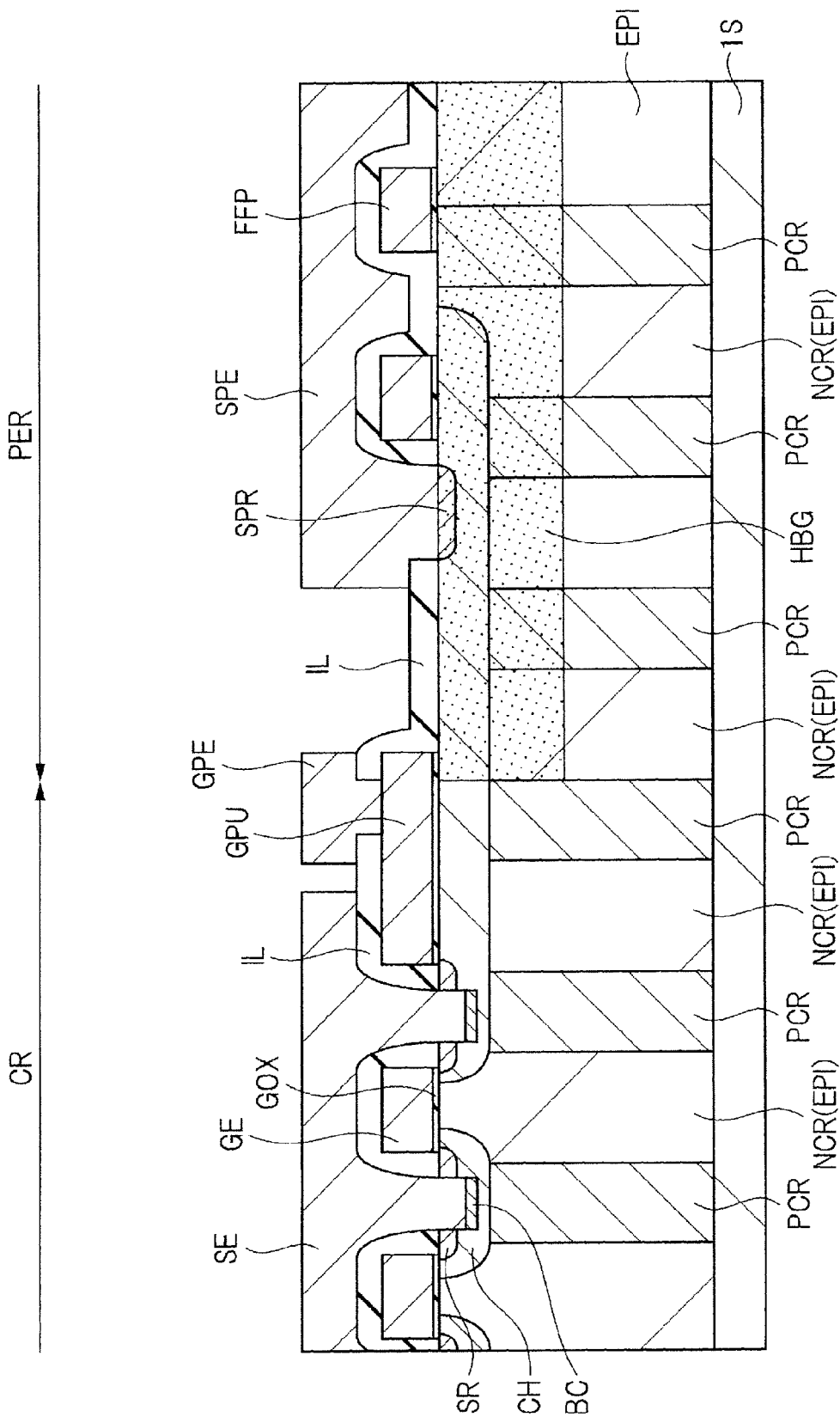
FIG. 22 is a cross sectional view showing the semiconductor device during a manufacturing step following FIG. 21.

Then, as shown in FIG. 22, over the interlayer insulation film IL including the trench including the body contact region BC formed at the bottom thereof, the opening for exposing the gate pull-up part GPU, and the opening for exposing the source pull-up region SPR, there is formed a metal film. The metal film is formed of, for example, a lamination film of a titanium tungsten film, and an aluminum film, and can be formed by using, for example, a sputtering method. Then, by using a photolithography technology and an etching technology, the metal film is patterned. As a result, in the cell region CR, there is formed a source electrode SE electrically coupled with the source region SR and the body contact region BC, and there is formed the gate pull-up electrode GPE electrically coupled with the gate pull-up part GPU. On the other hand, in the peripheral region PER, there is formed a source pull-up electrode SPE electrically coupled with the source pull-up region SPR.

Then, as shown in FIG. 15, a surface protective film PAS is formed in such a manner as to cover the source electrode SE, the gate pull-up electrode GPE, and the source pull-up electrode SPE. Then, by using a photolithography technology and an etching technology, the surface protective film PAS is patterned, thereby to expose a partial region of the source electrode SE, a partial region of the gate pull-up electrode GPE, and a partial region of the source pull-up electrode SPE from the surface protective film. PAS. This allows the regions exposed from the surface protective film PAS to function as external coupling regions. In the manner described up to this point, it is possible to manufacture the semiconductor device in the present Second Embodiment.

<Advantage of Trench Fill Method>

For example, with the "trench fill method" used in the manufacturing method in the present Second Embodiment, a thick epitaxial layer EPI has been previously formed. For this reason, it becomes difficult to form a lower band gap region LBG in a deep region of the cell region CR. This is for the following reason: for example, the lower band gap region LBG is formed by doping a lower band gap impurity into the epitaxial layer EPI by an ion implantation method; however, when the epitaxial layer EPI has been previously increased in thickness, the implantation energy in the ion implantation method must be increased, which is difficult to implement. Therefore, in the present Second Embodiment, the lower band gap region LBG is not formed in the cell region CR. On the other hand, the higher band gap region HBG formed in the peripheral region PER is formed in a shallow region of the epitaxial layer EPI, and hence can also be formed with ease in the present Second Embodiment using the "trench fill method". For this reason, also in the present Second Embodiment, the higher band gap region HBG is formed in the peripheral region PER.

The description up to this point indicates as follows: in consideration of the point that the lower band gap region LBG can be formed in the cell region CR, the "multi-epitaxial method" described in the First Embodiment can be considered superior to the "trench fill method" described in the present Second Embodiment from the viewpoint of causing an avalanche breakdown phenomenon in the cell region CR rather than in the peripheral region PER.

However, the "trench fill method" described in the present Second Embodiment is also superior in some points to the "multi-epitaxial method" described in the First Embodiment. Accordingly, below, this point will be described.

For example, in a superjunction structure, from the viewpoint of reducing the ON resistance, it is effective to narrow the distance between the p column region PCR and the n column region NCR. This is for the following reason: from the viewpoint of reducing the ON resistance, it is desirable to increase the impurity concentration of the n column region NCR which is the current path. Namely, when the impurity concentration of the n column region NCR is increased in order to reduce the ON resistance, extension of the depletion layer to the n column region NC is reduced. Accordingly, in order to deplete the whole n column region NCR, the width of the n column region NCR is required to be reduced. Therefore, while increasing the impurity concentration of the n column region NCR, thereby to reduce the ON resistance in the power MOSFET of a superjunction structure, the breakdown voltage is also ensured. In consideration of this, it is necessary to narrow the distance between the p column region PCR and the n column region NCR.

In this regard, with the "multi-epitaxial method", the p column region PCR is formed by an ion implantation method. For this reason, in consideration of the impurity diffusing effect, it is not possible to sufficiently narrow the distance between the p column region PCR and the n column region NCR. On the other hand, with the "trench fill method", the p column region PCR is formed by an filling epitaxial method into the trench DIT formed in the epitaxial layer EPI. For this reason, with the "trench fill method", the formation precision of the p column region PCR is determined by the formation precision of the trench DIT. Then, the trench DIT is formed by a photolithography technology.

At this step, the precision of the photolithography technology is higher than the precision of the ion implantation method. For this reason, with the "trench fill method", the p column region PCR can be formed with a higher precision than with the "multi-epitaxial method". This means that, with the "trench fill method", the distance between the p column region PCR and the n column region NCR can be more narrowed than with the "multi-epitaxial method". As a result, the "trench fill method" has an advantage of being capable of manufacturing a power MOSFET with a smaller ON resistance than with the "multi-epitaxial method". Namely, the "trench fill method" has a superiority to the "multi-epitaxial method" in that a power MOSFET with a smaller ON resistance can be manufactured while ensuring the breakdown voltage.

Third Embodiment

In the First Embodiment and the Second Embodiment, a description has been given to the example in which a novel technical idea is applied to a power MOSFET having a superjunction structure. However, in the present Third Embodiment, a description will be given to an example in which novel technical idea is applied to a power MOSFET not of a superjunction structure but of a common structure. For example, power MOSFETs of a common structure include a planar type power MOSFET and a trench gate type power MOSFET. The novel technical idea of the present specification is applicable to power MOSFETs of any common structure. Particularly, in the present Third Embodiment, a description will be given to an example in which a novel technical idea is applied to a trench gate type power MOSFET. Further, in the present Third Embodiment, a description will be given by taking not a power MOSFET using a silicon substrate (which will be hereinafter described as a Si power MOSFET), but a power MOSFET using a silicon carbide substrate (which will be hereinafter described as a SiC power MOSFET) as an example.

<Advantages of SiC Power MOSFET>

In the field of a power MOSFET which is one of power semiconductor elements, a Si power MOSFET using a silicon substrate (Si substrate) is the main stream. However, the SiC power MOSFET using a silicon carbide substrate (SiC substrate) has an advantage of being capable of achieving a higher breakdown voltage and lower loss as compared with the Si power MOSFET. This is for the following reason: silicon carbide is larger in band gap than silicon, so that the breakdown voltage becomes larger; as a result, even when the epitaxial layer (drift layer) is made thin, the breakdown voltage can be ensured. In other words, the SiC power MOSFET has advantages of being capable of ensuring the breakdown voltage even when the epitaxial layer is made thin, and being capable of reducing the ON resistance of the SiC power MOSFET due to a decrease in thickness of the epitaxial layer. For this reason, for example, in the field of power saving or environmentally friendly inverter technology, attention has been focused on a SiC power MOSFET.

<Configuration of SiC Power MOSFET>

Figure 23:
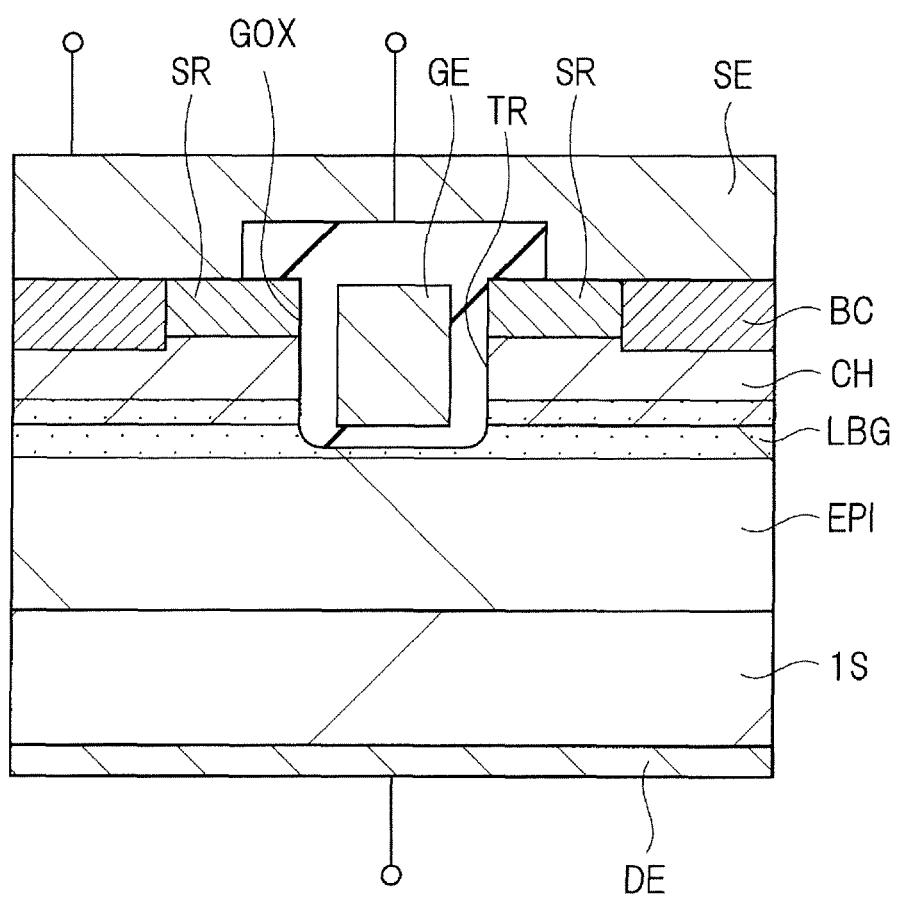
FIG. 23 is a cross sectional view showing a configuration of a semiconductor device in Third Embodiment.

Below, a description will be given to a configuration of a SiC power MOSFET in the present Third Embodiment. The basic structure of the SiC power MOSFET is the same as that of a Si power MOSFET. FIG. 23 is a cross sectional view showing a configuration of a SiC power MOSFET in the present Third Embodiment. As shown in FIG. 23, in the SiC power MOSFET in the present Third Embodiment, at the back surface (bottom surface) of a semiconductor substrate 1S formed of, for example, silicon carbide, there is formed a drain electrode DE. In the front surface (top surface) of the semiconductor substrate 1S, there is formed an epitaxial layer EPI formed of an n type semiconductor layer obtained by, for example, doping silicon carbide with an n type impurity.

In the epitaxial layer EPI, there is formed a channel region CH formed of a p type semiconductor region, and a trench TR is formed in such a manner as to penetrate through the channel region CH. Then, at the inner wall of the trench TR, there is formed a gate insulation film GOX. In addition, in the inside of the trench TR, a gate electrode GE is embedded via the gate insulation film GOX.

Further, a source region SR formed of an n type semiconductor region is formed in such a manner as to be internally included in the channel region CH, and to be in contact with the trench TR. There is formed a body contact region BC formed of a p type semiconductor region in contact with the source region SR, and electrically coupled with the channel region CH. Then, a source electrode SE is formed in such a manner as to electrically coupled with both of the source region SR and the body contact region BC.

In the thus configured SiC power MOSFET in the present Third Embodiment, as shown in FIG. 23, a lower band gap region LBG is formed in such a manner as to include the pn junction formed in the boundary region between the epitaxial layer EPI and the channel region CH. The lower band gap region LBG is formed of a semiconductor region obtained by, for example, doping silicon carbide with silicon. Also in the present Third Embodiment, the lower band gap region LBG is formed only in the cell region, and is not formed in the peripheral region (not shown in FIG. 23). As a result, the avalanche breakdown voltage of the lower band gap region LBG is lower than the avalanche breakdown voltage of the peripheral region.

Therefore, for example, in the case where the SiC power MOSFET is applied with a voltage equal to or larger than the power supply voltage under the influence of the inductance included in the load, when the voltage exceeds the avalanche breakdown voltage of the lower band gap region LBG, an avalanche breakdown phenomenon is caused in the lower band gap region LBG of the SiC power MOSFET. In other words, also with the SiC power MOSFET in the present Third Embodiment, the lower band gap region LBG having a low avalanche breakdown voltage is formed in the cell region. As a result, without causing an avalanche breakdown phenomenon in the peripheral region, it is possible to cause an avalanche breakdown phenomenon in the cell region. Accordingly, also with the present Third Embodiment, it is possible to effectively suppress the occurrence of an avalanche breakdown phenomenon in the peripheral region PER in which an avalanche current locally concentrates. As a result, the power MOSFET can be prevented from being broken due to exceeding of the avalanche resistance of the power MOSFET. Consequently, also with the SiC power MOSFET in the present Third Embodiment, even when the SiC power MOSFET is applied with a voltage exceeding the power supply voltage to cause an avalanche breakdown phenomenon, the situation leading to breakage of the SiC power MOSFET can be avoided. For this reason, also in accordance with the present Third Embodiment, it is possible to improve the reliability of the semiconductor device including a SiC power MOSFET.

Fourth Embodiment

In the First Embodiment, for example, as shown in FIG. 1, a description has been given by taking the semiconductor device (discrete product) including the semiconductor chip CHP1 having a power MOSFET formed therein as an example. However, the novel technical idea of the present specification is not limited thereto, and is also applicable to a semiconductor device including a semiconductor chip including a power semiconductor element and an integrated circuit (IC) merged therein.

Figure 24:
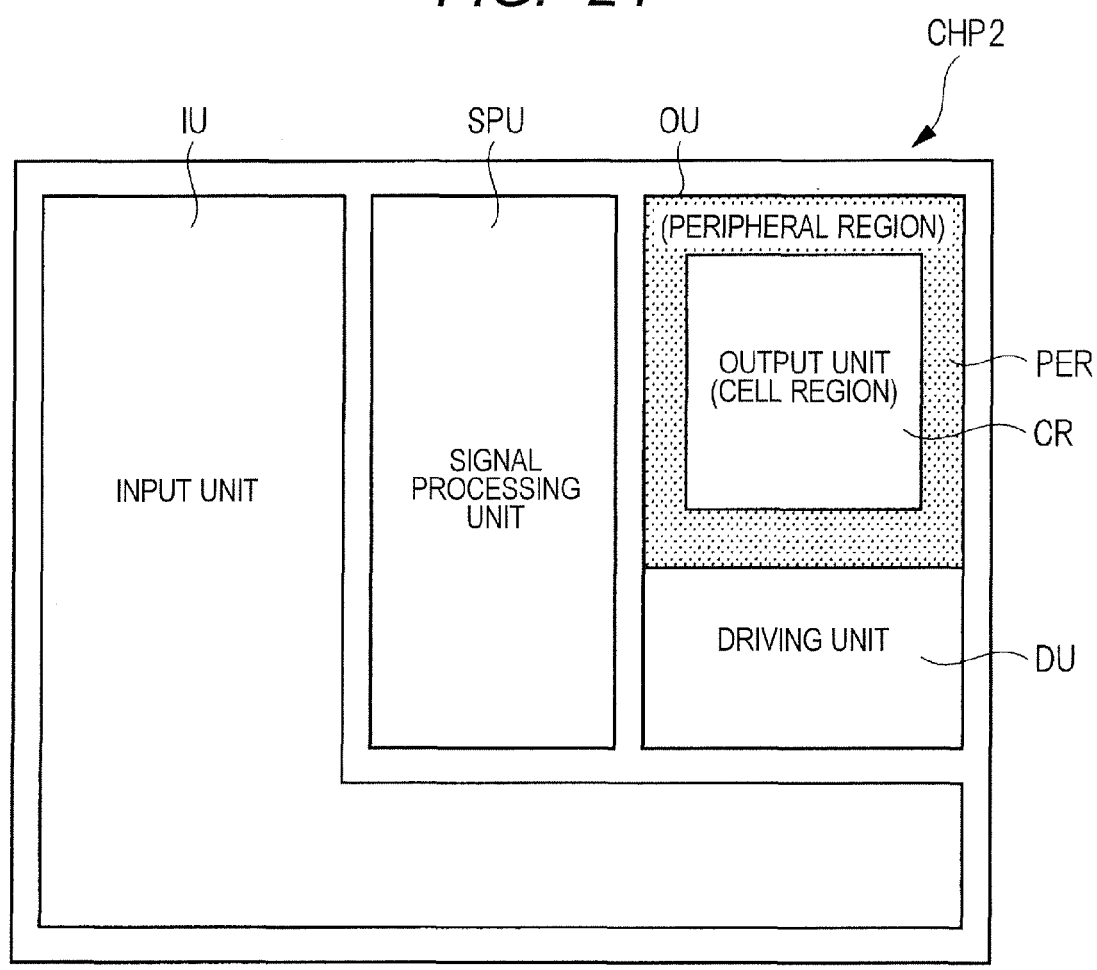
FIG. 24 is a schematic view showing a planar configuration of a semiconductor chip in Fourth Embodiment.

FIG. 24 is a schematic view showing a layout configuration of a semiconductor chip CHP2 in the present Fourth Embodiment. As shown in FIG. 24, the semiconductor chip CHP2 in the present Fourth Embodiment is formed in a rectangular shape, and has an input unit IU, a signal processing unit SPU, a driving unit DU, and an output unit OU. The input unit IU includes an input circuit formed of, for example, a CMOS circuit formed therein, and receives an input signal from an external device. Then, the signal processing unit SPU includes a processor formed of, for example, a digital circuit, and is formed of a signal processing circuit for processing an input signal inputted from the input unit IU. Then, the output unit OU includes, for example, a power semiconductor element, and includes an output circuit for outputting the signal processed at the signal processing unit SPU as an output signal. The output unit OU is driving-controlled by the driving unit DU including, for example, a CMOS circuit, and the output unit OU is formed of a cell region CR and a peripheral region PER. Then, a power semiconductor element is formed in the cell region CR. At this step, a higher band gap region is formed in the peripheral region PER.

Therefore, when attention is paid to the output unit OU including a power semiconductor element formed therein in the semiconductor chip CHP2 in the present Fourth Embodiment, the avalanche breakdown voltage of the higher band gap region formed in the peripheral region PER is higher than the avalanche breakdown voltage of the cell region CR. Therefore, for example, even when the power semiconductor element is applied with a voltage equal to or larger than the power supply voltage under the influence of the inductance included in the load, without causing an avalanche breakdown phenomenon in the peripheral region PER, an avalanche breakdown phenomenon is caused in the cell region CR. Accordingly, in accordance with the present Fourth Embodiment, it is possible to effectively suppress the occurrence of an avalanche breakdown phenomenon in the peripheral region PER in which an avalanche current locally concentrates. As a result, the power semiconductor element can be prevented from being broken due to exceeding of the avalanche resistance of the power semiconductor element. Consequently, with the power semiconductor element in the present Fourth Embodiment, even when the power semiconductor element is applied with a voltage exceeding the power supply voltage to cause an avalanche breakdown phenomenon, the situation leading to breakage of the power semiconductor element can be avoided. For this reason, also in accordance with the present Fourth Embodiment, it is possible to improve the reliability of the semiconductor device including a power semiconductor element.

Up to this point, the invention made by the present inventors has been specifically described by way of embodiments thereof. However, It is naturally understood that the present invention is not limited to the embodiments, and may be variously changed within the scope not departing from the gist thereof.

For example, in the embodiments, the novel technical idea has been described by taking a power MOSFET as a power semiconductor element as an example. However, the novel technical idea described in the present specification is not limited thereto, and is widely applicable to semiconductor devices including power semiconductor elements represented by, for example, an IGBT or a diode.

The embodiments include the following forms.

(Additional Statement 1)

A method for manufacturing a semiconductor device having a cell region, and a peripheral region formed outside the cell region, the method including the steps of:

(a) providing a semiconductor substrate including a first epitaxial layer of a first conductivity type formed over a main surface thereof, (b) doping a lower band gap impurity for making the band gap smaller than the band gap of the first epitaxial layer before doping into the first epitaxial layer in the cell region, and thereby forming a lower band gap region, (c) after the step (b), forming a plurality of first column regions of a second conductivity type which is the opposite conductivity type to the first conductivity type in such a manner as to be separated from one another in the first epitaxial layer extending from the cell region to the peripheral region, (d) after the step (c), forming a second epitaxial layer of the first conductivity type over the first epitaxial layer extending from the cell region to the peripheral region, (e) after the step (d), forming a plurality of second column regions of the second conductivity type to be electrically coupled with the first column regions, respectively, in such a manner as to be separated from one another in the second epitaxial layer, (f) after the step (e), repeatedly carrying out the same step as the step (d), and the same step as the step (e), and thereby forming a third epitaxial layer including a plurality of third column regions formed therein to an Nth epitaxial layer including a plurality of Nth column regions formed therein in lamination over the second epitaxial layer, and (g) after the step (f), forming an element part at the surface of the Nth epitaxial layer.

(Additional Statement 2)

The method for manufacturing a semiconductor device according to Additional Statement 1, wherein, in the cell region, the lower band gap region is formed in a deeper region than half the thickness of the lamination region extending from each of the first column regions to each of the Nth column regions.

(Additional Statement 3)

The method for manufacturing a semiconductor device according to Additional Statement 1, wherein the first epitaxial layer is formed of silicon, and wherein the lower band gap impurity is carbon or germanium.

(Additional Statement 4)

The method for manufacturing a semiconductor device according to Additional Statement 3, wherein in the step (b), the carbon is doped with a concentration of 0.5 mol % or more and 1.0 mol % or less into the first epitaxial layer, thereby to form the lower band gap region.

(Additional Statement 5)

The method for manufacturing a semiconductor device according to Additional Statement 3, wherein in the step (b), the germanium is doped with a concentration of 10 mol % or more and 20 mol % or less into the first epitaxial layer, thereby to form the lower band gap region.

(Additional Statement 6)

The method for manufacturing a semiconductor device according to Additional Statement 1, wherein the step (b) uses an ion implantation method.

(Additional Statement 7)

The method for manufacturing a semiconductor device according to Additional Statement 1, wherein the step (f) includes a step of doping a higher band gap impurity for making the band gap larger than the band gap of the epitaxial layer before doping into the epitaxial layer in the peripheral region, and thereby forming a higher band gap region in one or more epitaxial layers of from the third epitaxial layer to the Nth epitaxial layer, and wherein, in the peripheral region, the higher band gap region is formed in a shallower region than half the thickness of the lamination region extending from each of the first column regions to each of the Nth column regions.

(Additional Statement 8)

The method for manufacturing a semiconductor device according to Additional Statement 7, wherein the higher band gap impurity is carbon, and wherein, in the step (b), the carbon is doped with a concentration of 20 mol % or more and 30 mol % or less into the first epitaxial layer, thereby to form the higher band gap region.

(Additional Statement 9)

A method for manufacturing a semiconductor device having a cell region, and a peripheral region formed outside the cell region, the method including the steps of:

(a) providing a semiconductor substrate including an epitaxial layer of a first conductivity type formed over a main surface thereof, (b) forming a plurality of trenches in the epitaxial layer extending from the cell region to the peripheral region, (c) filling a semiconductor film of a second conductivity type which is the opposite conductivity type to the first conductivity type in each of the trenches, and thereby forming a plurality of second conductivity type column regions of the second conductivity type in such a manner as to be separated from one another, (d) doping a higher band gap impurity for making the band gap larger than the band gap of the epitaxial layer before doping into the epitaxial layer in the peripheral region, and thereby forming a higher band gap region, and (e) after the step (d), forming an element part at the surface of the epitaxial layer, wherein, in the peripheral region, the higher band gap region is formed in a shallower region than half the depth of each of the second conductivity type column regions.

(Additional Statement 10)

The method for manufacturing a semiconductor device according to Additional Statement 9, wherein the step (d) uses an ion implantation method.

(Additional Statement 11)

The method for manufacturing a semiconductor device according to Additional Statement 9, wherein the epitaxial layer is formed of silicon, wherein the higher band gap impurity is carbon, and wherein in the step (d), the carbon is doped with a concentration of 20 mol % or more and 30 mol % or less into the epitaxial layer, thereby to form the higher band gap region.

What is claimed is:

1. A method for manufacturing a semiconductor device including a cell region and a peripheral region formed outside the cell region, comprising:

(a) providing a semiconductor substrate including a first epitaxial layer of a first conductivity type formed over a main surface thereof, (b) doping a lower band gap impurity for making the band gap smaller than the band gap of the first epitaxial layer before doping into the first epitaxial layer in the cell region, and thereby forming a lower band gap region, (c) after the step (b), forming a plurality of first column regions of a second conductivity type which is an opposite conductivity type to the first conductivity type in such a manner as to be separated from one another in the first epitaxial layer extending from the cell region to the peripheral region, (d) after the step (c), forming a second epitaxial layer of the first conductivity type over the first epitaxial layer extending from the cell region to the peripheral region, (e) after the step (d), forming a plurality of second column regions of the second conductivity type to be electrically coupled with the first column regions, respectively, in such a manner as to be separated from one another in the second epitaxial layer, (f) after the step (e), repeatedly carrying out the same step as the step (d), and the same step as the step (e), and thereby forming a third epitaxial layer including a plurality of third column regions formed therein to an Nth epitaxial layer including a plurality of Nth column regions formed therein in lamination over the second epitaxial layer, and (g) after the step (f), forming an element part at the surface of the Nth epitaxial layer.

2. A method for manufacturing a semiconductor device according to claim 1,
wherein, in the cell region, the lower band gap region is formed in a deeper region than half a thickness of a lamination region extending from each of the first column regions to each of the Nth column regions.

3. A method for manufacturing a semiconductor device according to claim 1,
wherein the first epitaxial layer is formed of silicon, and
wherein the lower band gap impurity is carbon or germanium.

4. A method for manufacturing a semiconductor device according to claim 3,
wherein in the step (b), the carbon is doped with a concentration of 0.5 mol % or more and 1.0 mol % or less into the first epitaxial layer, thereby to form the lower band gap region.

5. A method for manufacturing a semiconductor device according to claim 3,
wherein in the step (b), the germanium is doped with a concentration of 10 mol % or more and 20 mol % or less into the first epitaxial layer, thereby to form the lower band gap region.

6. A method for manufacturing a semiconductor device according to claim 1,
wherein the step (b) uses an ion implantation method.

7. A method for manufacturing a semiconductor device according to claim 1,
wherein the step (f) includes doping a higher band gap impurity for making the band gap larger than the band gap of the epitaxial layer before doping into the epitaxial layer in the peripheral region, and thereby forming a higher band gap region in one or more epitaxial layers of the third epitaxial layer to the Nth epitaxial layer, and
wherein, in the peripheral region, the higher band gap region is formed in a shallower region than half a thickness of the lamination region extending from each of the first column regions to each of the Nth column regions.

8. A method for manufacturing a semiconductor device according to claim 7,
wherein the higher band gap impurity is carbon, and
wherein, in the step (b), the carbon is doped with a concentration of 20 mol % or more and 30 mol % or less into the first epitaxial layer, thereby to form the higher band gap region.

9. A method for manufacturing a semiconductor device including a cell region and a peripheral region formed outside the cell region, comprising:

(a) providing a semiconductor substrate including an epitaxial layer of a first conductivity type formed over a main surface thereof, (b) forming a plurality of trenches in the epitaxial layer extending from the cell region to the peripheral region, (c) filling a semiconductor film of a second conductivity type which is an opposite conductivity type to the first conductivity type in each of the trenches, and thereby forming a plurality of second conductivity type column regions of the second conductivity type in such a manner as to be separated from one another, (d) doping a higher band gap impurity for making a larger band gap than a band gap of the epitaxial layer before doping into the epitaxial layer in the peripheral region, and thereby forming a higher band gap region, and (e) after the step (d), forming an element part at the surface of the epitaxial layer, wherein, in the peripheral region, the higher band gap region is formed in a shallower region than half a depth of each of the second conductivity type column regions.

10. A method for manufacturing a semiconductor device according to claim 9,
wherein the step (d) uses an ion implantation method.

11. A method for manufacturing a semiconductor device according to claim 9,
wherein the epitaxial layer is formed of silicon,
wherein the higher band gap impurity is carbon, and
wherein in the step (d), the higher band gap impurity is doped with a concentration of 20 mol % or more and 30 mol % or less into the epitaxial layer, thereby to form the higher band gap region.

* * * * *